(12) United States Patent
Kurjanowicz

(10) Patent No.: US 7,944,727 B2
(45) Date of Patent: *May 17, 2011

(54) MASK PROGRAMMABLE ANTI-FUSE ARCHITECTURE

(75) Inventor: Wlodek Kurjanowicz, Ottawa (CA)

(73) Assignee: Sidense Corp., Ottawa, Ontario (CA)

( * ) Notice: Subject to any disclaimer, the term of this patent is extended or adjusted under 35 U.S.C. 154(b) by 140 days.

This patent is subject to a terminal disclaimer.

(21) Appl. No.: 12/306,114

(22) PCT Filed: Dec. 20, 2007

(86) PCT No.: PCT/CA2007/002287
§ 371 (c)(1),
(2), (4) Date: Dec. 22, 2008

(87) PCT Pub. No.: WO2008/077240
PCT Pub. Date: Jul. 3, 2008

(65) Prior Publication Data
US 2009/0262566 A1    Oct. 22, 2009

Related U.S. Application Data

(60) Provisional application No. 60/871,519, filed on Dec. 22, 2006.

(51) Int. Cl.
*G11C 17/00* (2006.01)
(52) U.S. Cl. ...................... 365/96; 365/225.7
(58) Field of Classification Search .............. 365/96, 365/225.7, 201, 230.06, 226
See application file for complete search history.

(56) References Cited

U.S. PATENT DOCUMENTS

| 5,495,436 | A | | 2/1996 | Callahan |
| 5,870,327 | A | | 2/1999 | Gitlin et al. |
| 5,909,049 | A | * | 6/1999 | McCollum .................... 257/530 |
| 6,590,797 | B1 | | 7/2003 | Nachumovsky et al. |
| 7,102,926 | B2 | | 9/2006 | Lee et al. |
| 7,329,911 | B2 | * | 2/2008 | Okayama ..................... 257/209 |
| 7,601,564 | B2 | * | 10/2009 | Okayama ..................... 438/131 |
| 7,626,881 | B2 | * | 12/2009 | Tomita ....................... 365/225.7 |
| 2003/0161184 | A1 | | 8/2003 | Lee et al. |

(Continued)

FOREIGN PATENT DOCUMENTS
DE    102004056459 A1    6/2006

(Continued)

OTHER PUBLICATIONS

European Patent Application No. 07855569.5, Supplementary Search Report dated Dec. 22, 2009.

(Continued)

*Primary Examiner* — Gene N. Auduong
(74) *Attorney, Agent, or Firm* — Shin Hung; Borden Ladner Gervais LLP

(57) ABSTRACT

A memory array having both mask programmable and one-time programmable memory cells connected to the wordlines and the bitlines. All memory cells of the memory array are configured as one-time programmable memory cells. Any number of these one-time programmable memory cells are convertible into mask programmable memory cells through mask programming, such as diffusion mask programming or contact/via mask programming. Manufacturing of such a hybrid memory array is simplified because both types of memory cells are constructed of the same materials, therefore only one common set of manufacturing process steps is required. Inadvertent user programming of the mask programmable memory cells is inhibited by a programming lock circuit.

29 Claims, 20 Drawing Sheets

U.S. PATENT DOCUMENTS

| | | |
|---|---|---|
| 2004/0153725 A1 | 8/2004 | Derner et al. |
| 2006/0244099 A1 | 11/2006 | Kurjanowicz |
| 2007/0205485 A1 | 9/2007 | Hsu et al. |
| 2007/0257331 A1 | 11/2007 | Kurjanowicz et al. |
| 2009/0180307 A1* | 7/2009 | Kurjanowicz .................. 365/96 |
| 2009/0251943 A1* | 10/2009 | Kurjanowicz .................. 365/96 |
| 2009/0290434 A1* | 11/2009 | Kurjanowicz ............ 365/189.05 |
| 2010/0002527 A1* | 1/2010 | Kurjanowicz ............ 365/189.05 |
| 2010/0011266 A1* | 1/2010 | Kurjanowicz ................ 714/735 |

FOREIGN PATENT DOCUMENTS

EP 0419202 A2 3/1991

OTHER PUBLICATIONS

U.S. Appl. No. 12/306,260 Office Action dated Apr. 14, 2010.

* cited by examiner

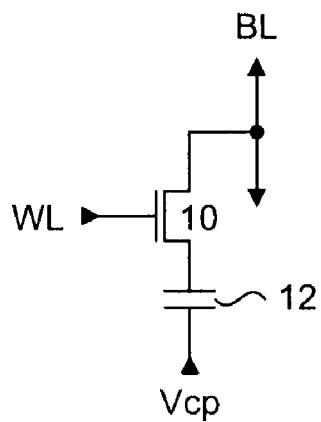
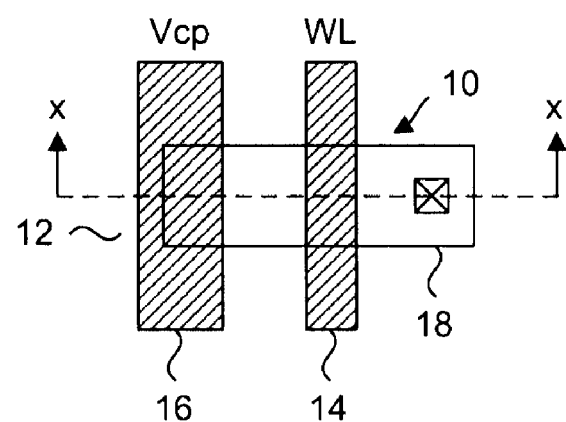
Figure 1 (Prior Art)   Figure 2 (Prior Art)
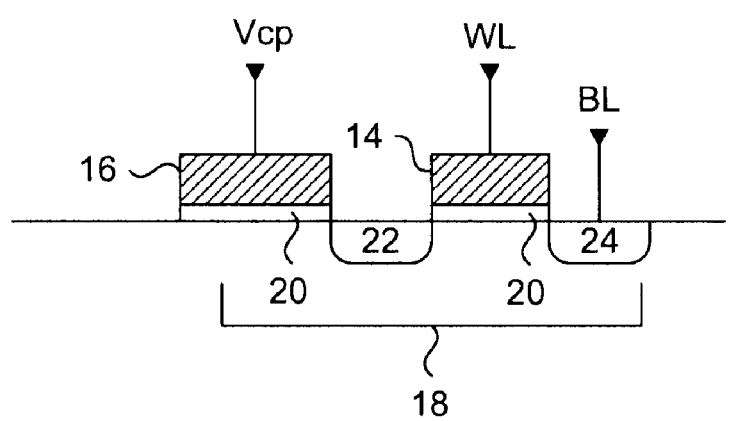
Figure 3 (Prior Art)

MASK PROGRAMMABLE ANTI-FUSE ARCHITECTURE

CROSS REFERENCE TO RELATED APPLICATIONS

This application claims the benefit of priority of U.S. Provisional Patent Application No. 60/871,519 filed Dec. 22, 2006, which is incorporated herein by reference in its entirety.

FIELD OF THE INVENTION

The invention is directed to non-volatile memories. More specifically, the invention is directed to mask programming of non-volatile memory cells.

BACKGROUND OF THE INVENTION

Over the past 30 years, anti-fuse technology has attracted significant attention of many inventors, IC designers and manufacturers. An anti-fuse is a structure alterable to a conductive state, or in other words, an electronic device that changes state from not conducting to conducting. Equivalently, the binary states can be either one of high resistance and low resistance in response to electric stress, such as a programming voltage or current. There have been many attempts to develop and apply anti-fuses in microelectronic industry, but the most successful anti-fuse applications to date can be seen in FGPA devices manufactured by Actel and Quicklogic, and redundancy or option programming used in DRAM devices by Micron. Anti-fuse technology is well known in the art, and example anti-fuse transistors are shown in FIGS. 1 to 5b.

Anti-fuse memory is one type of one-time programmable (OTP) memory in which the device can be permanently programmed (electrically) with data once. This data is programmed by an end user for a particular application. There are several types of OTP memory cells which can be used. OTP memories provide users with a level flexibility since any data can be programmed.

Anti-fuse memory can be utilized in all one time programmable applications, including RF-ID tags. RF-ID tagging applications are gaining more acceptance in the industry, particularly in sales, security, transport, logistics, and military applications for example. The simplicity and full CMOS compatibility anti-fuse memory allows for application of the RF-ID tag concept to integrated circuit manufacturing and testing processes. Therefore, IC manufacturing productivity can be increased by utilizing anti-fuse memory in combination with an RF communication interface on every wafer and/or every die on the wafer allowing for contact-less programming and reading chip specific or wafer specific information during IC manufacturing and packaging, as well as during printed circuit board assembly.

FIG. 1 is a circuit diagram illustrating the basic concept of an anti-fuse memory cell, while FIGS. 2 and 3 show the planar and cross-sectional views respectively, of the anti-fuse memory cell shown in FIG. 1. The memory cell of FIG. 1 includes a pass, or access transistor 10 for coupling a bitline BL to a bottom plate of anti-fuse device 12. A wordline WL is coupled to the gate of access transistor 10 to turn it on, and a cell plate voltage Vcp is coupled to the top plate of anti-fuse device 12 for programming anti-fuse device 12.

It can be seen from FIGS. 2 and 3 that the layout of access transistor 10 and anti-fuse device 12 is very straight-forward and simple. The gate 14 of access transistor 10 and the top plate 16 of anti-fuse device 12 are constructed with the same layer of polysilicon, which extend across active area 18. In the active area 18 underneath each polysilicon layer, is formed a thin gate oxide 20, also known as a gate dielectric, for electrically isolating the polysilicon from the active area underneath. On either side of gate 14 are diffusion regions 22 and 24, where diffusion region 24 is coupled to a bitline. Although not shown, those of skill in the art will understand that standard CMOS processing, such as sidewall spacer formation, lightly doped diffusions (LDD) and diffusion and gate silicidation, can be applied. While the classical single transistor and capacitor cell configuration is widely used, a transistor-only anti-fuse cell is further desirable due to the semiconductor array area savings that can be obtained for high-density applications. Such transistor-only anti-fuses must be reliable while simple to manufacture with a low cost CMOS process.

FIG. 4a shows a cross-sectional view of an anti-fuse transistor that can be manufactured with any standard CMOS process. Variants of this anti-fuse transistor are disclosed in commonly owned U.S. patent application Ser. No. 10/553,873 filed on Oct. 21, 2005, and commonly owned U.S. patent application Ser. No. 11/762,552 filed on Jun. 13, 2007, the contents of which are incorporated by reference. In the presently shown example, the anti-fuse transistor is almost identical to a simple thick gate oxide, or input/output MOS transistor with one floating diffusion terminal. The disclosed anti-fuse transistor, also termed a split-channel capacitor or a half-transistor, can be reliably programmed such that the fuse link between the polysilicon gate and the substrate can be predictably localized to a particular region of the device. The cross-section view of FIG. 4a is taken along the channel length of the device, which in the presently described example is a p-channel device. The channel is generally understood to be the area underneath an overlying polysilicon gate, having a length defined by edges of the polysilicon gate adjacent respective diffusion regions.

Anti-fuse transistor 30 includes a variable thickness gate oxide 32 formed on the substrate channel region 34, a polysilicon gate 36, sidewall spacers 38, a field oxide region 40 a diffusion region 42, and an LDD region 44 in the diffusion region 42. A bitline contact 46 is shown to be in electrical contact with diffusion region 42. The variable thickness gate oxide 32 consists of a thick oxide and a thin gate oxide such that a portion of the channel length is covered by the thick gate oxide and the remaining portion of the channel length is covered by the thin gate oxide. Generally, the thin gate oxide is a region where oxide breakdown can occur. The thick gate oxide edge meeting diffusion region 42 on the other hand, defines an access edge where gate oxide breakdown is prevented and current between the gate 36 and diffusion region 42 is to flow for a programmed anti-fuse transistor. While the distance that the thick oxide portion extends into the channel region depends on the mask grade, the thick oxide portion is preferably formed to be at least as long as the minimum length of a high voltage transistor formed on the same chip.

In this example, the diffusion region 42 is connected to a bitline through a bitline contact 46, or other line for sensing a current from the polysilicon gate 36, and can be doped to accommodate programming voltages or currents. This diffusion region 42 is formed proximate to the thick oxide portion of the variable thickness gate oxide 32. To further protect the edge of anti-fuse transistor 30 from high voltage damage, or current leakage, a resistor protection oxide (RPO), also known as a salicide protect oxide, can be introduced during the fabrication process to further space metal particles from the edge of sidewall spacer 38. This RPO is preferably used during the salicidiation process for preventing only a portion of diffusion region 42 and a portion of polysilicon gate 36 from being salicided. It is well known that salicided transistors are known to have higher leakage and therefore lower breakdown voltage. Thus having a non-salicided diffusion region 42 will reduce leakage. Diffusion region 42 can be doped for low voltage transistors or high voltage transistors or a combination of the two resulting in same or different diffusion profiles.

A simplified plan view of the anti-fuse transistor 30 is shown in FIG. 4b. Bitline contact 46 can be used as a visual reference point to orient the plan view with the corresponding cross-sectional view of FIG. 4a. The active area 48 is the region of the device where the channel region 34 and diffusion region 42 is formed, which is defined by an OD mask during the fabrication process. The dashed outline 50 defines the areas in which the thick gate oxide is to be formed via an OD2 mask during the fabrication process. More specifically, the area enclosed by the dashed outline 50 designates the regions where thick oxide is to be formed. OD simply refers to an oxide definition mask that is used during the CMOS process for defining the regions on the substrate where the oxide is to be formed, and OD2 refers to a second oxide definition mask different than the first. Details of the CMOS process steps for fabricating anti-fuse transistor 30 will be discussed later. According to an embodiment of the present invention, the thin gate oxide area bounded by edges of the active area 48 and the rightmost edge of the OD2 mask, is minimized. In the presently shown embodiment, this area can be minimized by shifting the rightmost OD2 mask edge towards the parallel edge of active area 48. Commonly owned U.S. patent application Ser. No. 11/762,552 filed on Jun. 13, 2007, the contents of which are incorporated by reference, describes alternate single transistor anti-fuse memory cells which can be used in a non-volatile memory array. Two transistor anti-fuse memory cells are known in the art, as shown in the example of FIGS. 5a and 5b.

FIG. 5b shows a planar view of a two-transistor anti-fuse memory cell 60 having a minimized thin gate oxide area that can be manufactured with any standard CMOS process, according to an embodiment of the present invention. FIG. 5a shows a cross-sectional view of the memory cell 60 of FIG. 5b, taken along line B-B. Two-transistor anti-fuse memory cell 60 consists of an access transistor in series with an anti-fuse transistor. The access transistor includes a polysilicon gate 62 overlying a thick gate oxide 64, which itself is formed over the channel 66. On the left side of the channel 66 is a diffusion region 68 electrically connected to a bitline contact 70. On the right side of the channel 66 is a common diffusion region 72 shared with the anti-fuse transistor. The anti-fuse transistor includes a polysilicon gate 74 overlying a thin gate oxide 76, which itself is formed over the channel 78. The thick gate oxide 64 can correspond to that used for high voltage transistors while the thin gate oxide 76 can correspond to that used for low voltage transistors. The dashed outline 77 defines the areas in which the thick gate oxide is to be formed via an OD2 mask during the fabrication process. More specifically, the area enclosed by the dashed outline 77 designates the regions where thick oxide is to be formed. While the right-most edge of dashed outline 77 is showed to be substantially aligned with an edge of the side-wall spacer adjacent to polysilicon gate 74, those skilled in the art will understand that this edge can be positioned anywhere between the side-wall spacers of polysilicon gates 62 and 74. It is well known that polysilicon gates 62 and 74 can be independently controlled, or alternatively can be connected to each other as shown in FIG. 5b. In the example of FIG. 5b, both polysilicon gates 62 and 74 are part of the same polysilicon structure, and connected to a wordline through wordline contact 80. Both diffusion regions 68 and 72 can have LDD regions, which can be identically doped or differently doped, depending on the desired operating voltages to be used. Commonly owned U.S. patent application Ser. No. 11/762,552 filed on Jun. 13, 2007 describes alternate two-transistor anti-fuse memory cells which can be used in a non-volatile memory array.

The programming speed of OTP memories is relatively slow, since each programming cycle will attempt to program a certain number of data words at the same time. Following each programming cycle is a program verify cycle to ensure that the data words were successfully programmed. Any bits that do not pass the program verify step are reprogrammed. This process continues until all the memory cell states have been successfully programmed.

There are applications where the same data is to be programmed in every OTP memory. Boot block data for example, can be the same in every chip in the batch, while the actual user data can be different. The boot block can be programmed by the end user, or by the vendor. In either case, a significant number of program cycles will be required for programming this boot block data to all the OTP memory devices in the batch. There may be other applications where a portion of every OTP memory device will store the same data. In some cases, this data is not intended to be accessible or known by the end user, thereby requiring programming before delivery to the end user for integration into their systems. However, this pre-programming will add time overhead, which is undesired.

Mask ROM memory is a class of non-volatile memory which is programmed with data during the chip manufacturing stage. In a chip manufacturing stage, masks are used to define which memory cells in the memory array are to be permanently turned off. Since programming is performed during chip manufacturing, the effective "programming" speed is extremely high. This technique is cost effective with economies of scale, due to the capital cost of the mask sets that are required. For example, known video gaming console game cartridges used Mask ROM chips to store game data, and the fast manufacturing of the chips allowed for large quantities of game cartridges to be sold worldwide with minimal time.

Unfortunately, Mask ROM is programmable only at the manufacturing stage, and does not give end users the ability to program their own data to the memory device. U.S. Pat. No. 7,102,926 discloses a memory device whereby a Mask ROM memory array is paired with an electrically erasable programmable read only memory (EEPROM). However, there is additional complexity and cost associated with such a device because the manufacturing process for Mask ROM differs substantially from that of an EEPROM. Furthermore, the additional cost for an EEPROM device is not economical for applications in which data is only programmed to the memory once.

It is, therefore, desirable to provide a low cost OTP memory device which is mask programmable while having user programmability.

SUMMARY OF THE INVENTION

It is an object of the present invention to obviate or mitigate at least one disadvantage of prior OTP memories. More specifically, it is an object of the present invention provide an anti-fuse memory that is both mask programmable and electrically programmable.

In a first aspect, the present invention provides a hybrid memory having electrically programmable and mask programmed memory cells arranged in rows and columns. The hybrid memory array includes a row of electrically programmable anti-fuse memory cells and a row of mask programmed anti-fuse memory cells. Each electrically programmable anti-fuse memory cell is connected to a bitline and has a predetermined layout and a gate oxide structure. Each mask programmed anti-fuse memory cell is connected to the bitline connected to one electrically programmable anti-fuse memory cell, and has substantially the predetermined layout and the gate oxide structure. Each mask programmed anti-fuse memory cell represents one logic state by being selectively mask programmed to have a permanent coupling to a voltage supply. Each mask programmed anti-fuse memory cell can represent another logic state by being selectively mask programmed to omit a channel region. According to an embodiment of the present aspect, the row of mask programmed anti-fuse memory cells includes an electrically programmable status memory cell, and the electrically programmable status memory cell is identical to each of the electrically programmable anti-fuse memory cells. According to further embodiments of the present aspect, the permanent coupling can include a contact electrically connected to the voltage supply and coupled to the bitline when a corresponding wordline is activated; a diffusion region connected to the voltage supply and coupled to the bitline when a corresponding wordline is activated; and a diffusion region connected to a corresponding wordline and coupled to the bitline when the corresponding wordline is driven to the voltage supply.

In a further embodiment, the row of mask programmed anti-fuse memory cells are coupled to a wordline receiving a programming voltage, the hybrid memory further including a program lock circuit coupled to the wordline for inhibiting the programming of the row of mask programmed anti-fuse memory cells. The program lock circuit includes a mask programmable inhibit circuit coupled to the wordline and programmed to a lock state for changing the programming voltage to a voltage level ineffective for programming in response to the wordline at the programming voltage.

In another embodiment of the present aspect, each of the electrically programmable anti-fuse memory cells and each of the mask programmable anti-fuse memory cells includes an access transistor and an electrically programmable anti-fuse transistor. The access transistor has a first diffusion region coupled to the bitline and a first polysilicon gate. The electrically programmable anti-fuse transistor is in series with the access transistor and has a second diffusion region shared with the access transistor, and a second polysilicon gate. The gate oxide structure including a thick gate oxide under the first polysilicon gate and a thin gate oxide under the second polysilicon gate. In the present embodiment, the first polysilicon gate is drivable to a read voltage during a read operation, and the second polysilicon gate is drivable to a programming voltage during a programming operation. In an alternate embodiment, the first polysilicon gate and the second polysilicon gate are electrically coupled to each other and to a wordline drivable to a programming voltage. The permanent coupling can include a contact electrically connected to the voltage supply and coupled to the bitline when the access transistor is activated; a third diffusion region connected to the voltage supply and coupled to the bitline when the access transistor and the electrically programmable anti-fuse transistor are activated; and a third diffusion region connected to a diffusion line, the diffusion line being coupled to the second polysilicon gate. Furthermore, each mask programmed anti-fuse memory cell representing another logic state is selectively mask programmed to omit a channel region.

In yet another embodiment of the present aspect, each of the electrically programmable anti-fuse memory cells and each of the mask programmable anti-fuse memory cells includes an electrically programmable anti-fuse transistor. The electrically programmable anti-fuse transistor has a diffusion region coupled to the bitline, and a polysilicon gate. The gate oxide structure including an oxide breakdown region fusible to form a conductive channel between the polysilicon gate and a substrate beneath the gate oxide structure. The gate oxide structure includes a variable thickness gate oxide having a thin gate oxide portion corresponding to the oxide breakdown region. The permanent coupling includes another diffusion region connected to the voltage supply, and coupled to the bitline when a wordline coupled to the polysilicon gate is activated. Alternately, the permanent coupling includes another diffusion region connected to a diffusion line, the diffusion line being coupled to the polysilicon gate. Each mask programmed anti-fuse memory cell representing another logic state can be selectively mask programmed to omit a channel region.

In a second aspect, the present invention provides a hybrid memory. The hybrid memory includes an electrically programmable anti-fuse memory cell and a mask programmed memory cell. The electrically programmable anti-fuse memory cell being connected to a corresponding bitline and a common wordline. The mask programmed memory cell is connected to another bitline and the common wordline for storing a validity bit. The electrically programmable anti-fuse memory cell includes an electrically programmable anti-fuse transistor having a diffusion region coupled to the bitline, and a polysilicon gate overlying a gate oxide structure. The gate oxide structure has an oxide breakdown region fusible to form a conductive channel between the polysilicon gate and a substrate beneath the gate oxide structure. The mask programmed memory cell can either omit a channel region underlying the common wordline, or include a permanent coupling to a voltage supply. The permanent coupling can include another diffusion region connected to the voltage supply, and coupled to the bitline when the wordline coupled to the polysilicon gate is activated.

In an embodiment of the present aspect, the hybrid memory further includes a second mask programmed memory cell and a second electrically programmable anti-fuse memory cell. The second mask programmed memory cell is connected to the corresponding bitline and a second common wordline. The second electrically programmable anti-fuse memory cell is connected to the another bitline and the second common wordline. In an alternate embodiment of the electrically programmable anti-fuse memory cell, the electrically programmable anti-fuse memory cell includes an access transistor and an electrically programmable anti-fuse transistor. The access transistor has a first diffusion region coupled to the bitline, and a first polysilicon gate. The electrically programmable anti-fuse transistor is in series with the access transistor and has a second diffusion region shared with the access transistor, and a second polysilicon gate. The gate oxide structure includes a thick gate oxide under the first polysilicon gate and a thin gate oxide under the second polysilicon gate.

Other aspects and features of the present invention will become apparent to those ordinarily skilled in the art upon review of the following description of specific embodiments of the invention in conjunction with the accompanying figures.

BRIEF DESCRIPTION OF THE DRAWINGS

Embodiments of the present invention will now be described, by way of example only, with reference to the attached Figures, wherein:

FIG. 1 is a circuit diagram of a DRAM-type anti-fuse cell;

FIG. 2 is a planar layout of the DRAM-type anti-fuse cell of FIG. 1;

FIG. 3 is a cross-sectional view of the DRAM-type anti-fuse cell of FIG. 2 along line x-x;

FIG. 4b is a planar layout of the variable thickness gate oxide anti-fuse transistor of FIG. 4a;

FIG. 5b is a planar layout of the two-transistor anti-fuse memory cell of FIG. 5a;

FIG. 7c is a plan view layout showing a hybrid memory array having alternate two transistor one-time programmable memory cells and two-transistor mask programmed memory cells, according to the alternative mask programming technique of FIG. 7a;

FIG. 8b is the plan view layout showing a hybrid memory array illustrating the alternative mask programming technique of FIG. 8a;

FIG. 10b is a plan view layout of two transistor mask programmed memory cells programmed using the alternative mask programming technique of FIG. 10a;

DETAILED DESCRIPTION

Generally, the present invention provides a memory array having both mask programmable and one-time programmable memory cells connected to the wordlines and the bitlines. All memory cells of the memory array are configured as one-time programmable memory cells. Any number of these one-time programmable memory cells are convertible into mask programmable memory cells through mask programming, such as diffusion mask programming or contact/via mask programming. Manufacturing of such a hybrid memory array is simplified because both types of memory cells are constructed of the same materials, therefore only one common set of manufacturing process steps is required. Inadvertent user programming of the mask programmable memory cells is inhibited by a programming lock circuit. Each row of data can be tagged as invalid by the user, while mask programmed data is protected from user invalidation.

Therefore, the same code can be mask programmed to a large number of memory devices during the manufacturing process simply by making the appropriate mask modifications to the masks used for manufacturing the one-time programmable memory device. More specifically, the masks will be modified to effect mask programming of specific memory cells of the memory array. After manufacturing, the memory devices can then be immediately shipped to users for programming their own data. The overhead for mask programming is minimal prior to device fabrication, and far less than the accumulated time required for post-manufacturing electrical programming of each memory device. Furthermore, the mask programmed lock circuit provides security against post-manufacturing programming of the mask programmed memory cells.

Figure 5A:
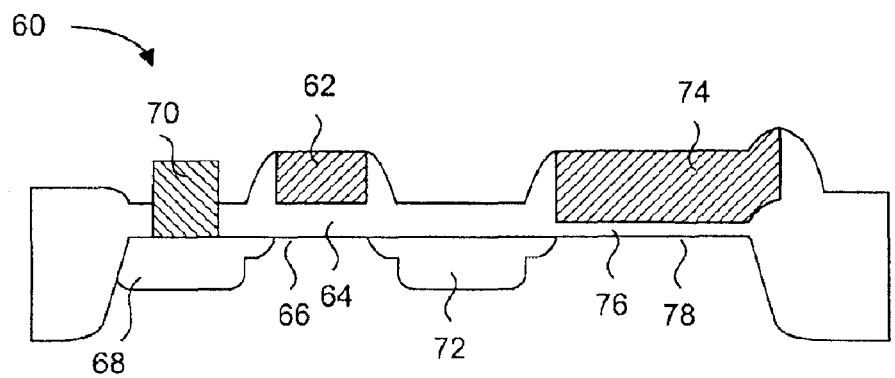
FIG. 5a is a cross-sectional view of a two-transistor anti-fuse memory cell.
Figure 5B:
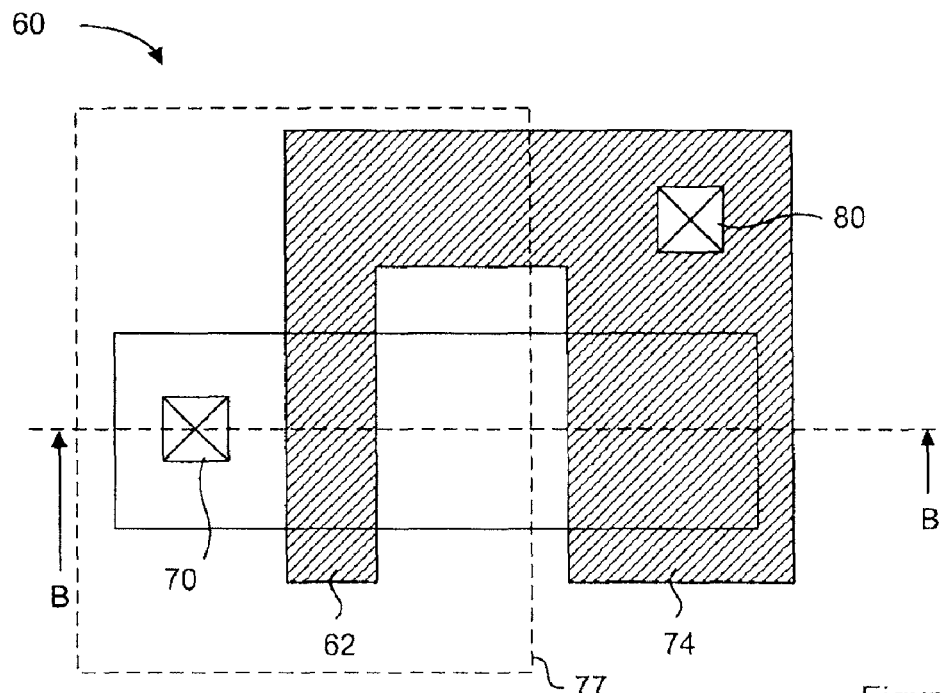
Figure 6:
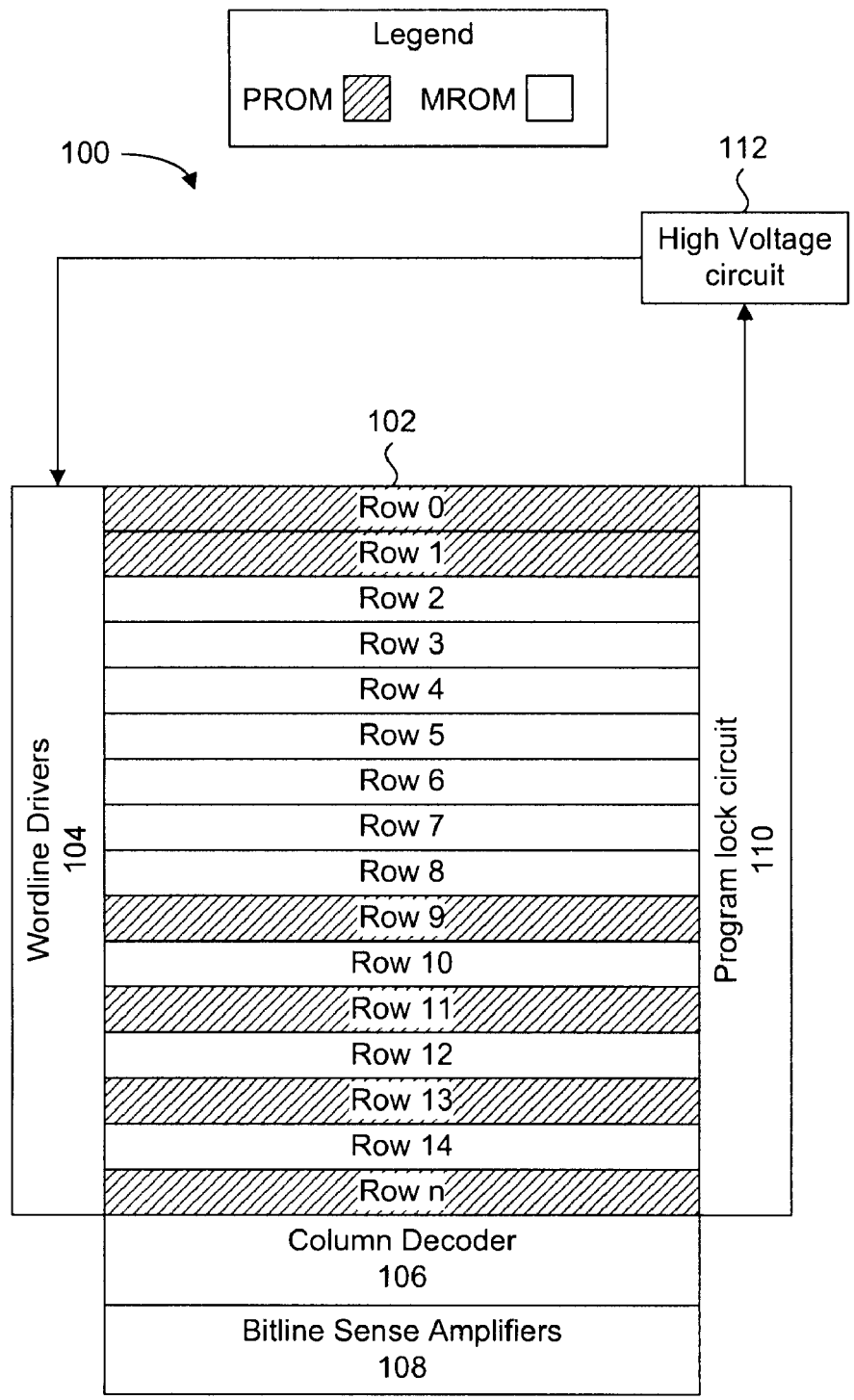
FIG. 6 is a block diagram of a hybrid one-time programmable and mask programmed memory, according to an embodiment of the present invention.

FIG. 6 is a block diagram of a hybrid one-time programmable and mask programmed memory, according to an embodiment of the present invention. The hybrid memory 100 includes a hybrid memory array 102, a wordline driver circuit block 104, a column decoder circuit block 106, a sense amplifier circuit block 108, a program lock circuit block 110, and a high voltage switch circuit 112. Those skilled in the art will understand that hybrid memory will include other circuit blocks to enable proper operation of the memory, but are not shown in FIG. 6 as they are not relevant to the embodiments of the invention. The hybrid memory array 102 consists of rows and columns of memory cells, where each row of memory cells are connected to a common wordline while each column of memory cells are connected to a common bitline. In the present embodiment, the one-time programmable memory cells and the mask programmed memory cells can have the memory cell configuration shown in FIGS. 4a and 4b or FIGS. 5a and 5b. As illustrated in FIG. 6, different rows of memory cells will consist of one type of memory cell. For example, Row 0, Row 1, Row 9, Row 11, Row 13 and the last row, Row n, will include only one-time programmable memory cells (PROM), while Row 2 to Row 8, Row 10, Row 12 and Row 14 will include only mask programmed memory cells (MROM). The different types of rows can be interleaved with each other, or grouped together in consecutive rows.

Because the same type of memory cell is used for both the one-time programmable memory cells and the mask programmed memory cells, the wordline pitch and bitline pitch is constant, thereby maximizing packing density of the memory array 102.

The wordline driver circuit block 104 includes individual wordline drivers for applying read and program voltages to the wordlines. In the present embodiment, the read and program voltages are provided by the high voltage switch circuit 112 in response to a control signal indicating that a read or program operation is to be executed. The high voltage switch circuit 112 can either generate the read and program voltages, or couple received read and program voltages to the wordline driver circuit block 104. Specific wordlines are selected for a read or program operation in response to an inputted row address. The column decoder circuit block 106 couples any preset number of bitlines to respective bitline sense amplifier circuits in sense amplifier circuit block 108, in response to an inputted column address. The column decoder circuit block 106 can couple the appropriate bias voltage levels to the bitlines for either promoting or inhibiting programming of a one-time programmable memory cell. Persons skilled in the art will understand that there are many possible architectures and circuit implementations for column decoder circuit block 106 and sense amplifier circuit block 108.

Because a row of mask programmed memory cells are essentially one-time programmable memory cells, they can be programmed if the bitlines are appropriately biased and the wordline is driven to the program voltage level. Therefore, according to another embodiment of the present invention, the program lock circuit block 110 is provided as a means for inhibiting programming of any row of memory cells, thereby protecting mask programmed data stored in that row. This inhibiting is achieved by disrupting the programming voltage from reaching the memory cells. Further details of the program lock circuit block 110 will follow later.

Figure 7A:
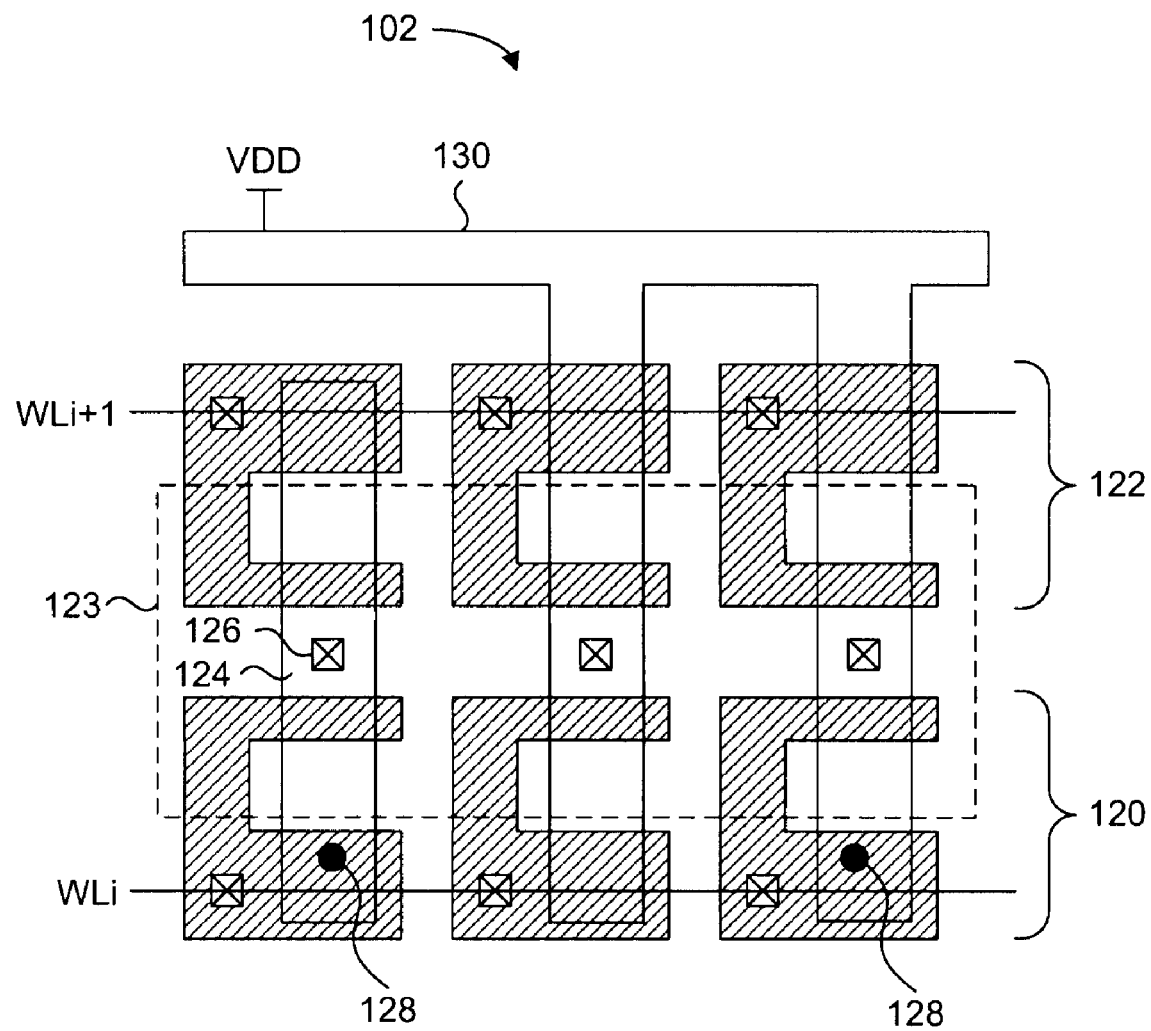
FIG. 7a is a plan view layout showing a hybrid memory array having two-transistor one-time programmable memory cells and two-transistor mask programmed memory cells, according to an embodiment of the present invention.

FIG. 7a is a plan view layout of a portion of the memory array 102 of FIG. 6 illustrating the integration of two-transistor one-time programmable memory cells and two-transistor mask programmed memory cells, according to an embodiment of the present invention. In the present example, a first row 120 of memory cells connected to wordline WLi are one-time programmable memory cells while a second row 122 of memory cells connected to adjacent wordline WLi+1 are mask programmed memory cells. Each memory cell of rows 120 and 122 are two-transistor anti-fuse memory cells having the same predetermined layout as shown in FIGS. 5a and 5b and the same gate oxide structure. The dashed outline 123 defines the areas in which the thick gate oxide is to be formed via an OD2 mask during the fabrication process, and is analogous to dashed outline 77 shown in FIG. 5a. The gate oxide structure refers to both the thin and thick gate oxide compositions of the access transistor and the anti-fuse transistor. In the configuration shown in FIG. 7a, each pair of memory cells from rows 120 and 122 share a common diffusion region 124 and common bitline contact 126. In the present example, one-time programmable memory cells of row 120 are electrically programmable, and may or may not have a fuse link 128 formed when a programming voltage on WLi is applied while the bitline is biased to ground, VSS or some other sufficiently low voltage level effective for creating fuse link 128 in the presence of the program voltage. During a read operation, WLi is driven to VDD and any memory cell of row 120 having a fuse link 128 will couple VDD from WLi to its corresponding bitline. Any memory cell of row 120 without a fuse link 128 will not have any effect on its corresponding bitline.

The mask programmed cells of row 122 are programmed by connecting the source diffusion to a high voltage level such as VDD to create the source-drain path for VDD, via the channel region underneath the thin gate oxide of the memory cell, such as thin gate oxide 76 shown in FIG. 5a. The connection is easily made by modifying the diffusion mask to include a diffusion region for coupling the selected memory cells of row 122 to a VDD coupled diffusion line 130. During a read operation, a memory cell of row 122 with the diffusion region will couple its corresponding bitline to the VDD coupled diffusion line 130 when the wordline WLi+1 is raised to VDD. In contrast, a memory cell of row 122 with an absence of the diffusion region cannot couple its corresponding bitline to the VDD coupled diffusion line 130, thereby resulting in no effect on the bitline. Therefore, the reading method for the memory cells of rows 120 and 122 is the same since the memory cells of row 120 having a fuse link 128 behave like a memory cell of row 122 having the diffusion region connected to the VDD diffusion line 130, and vice versa.

Figure 7B:
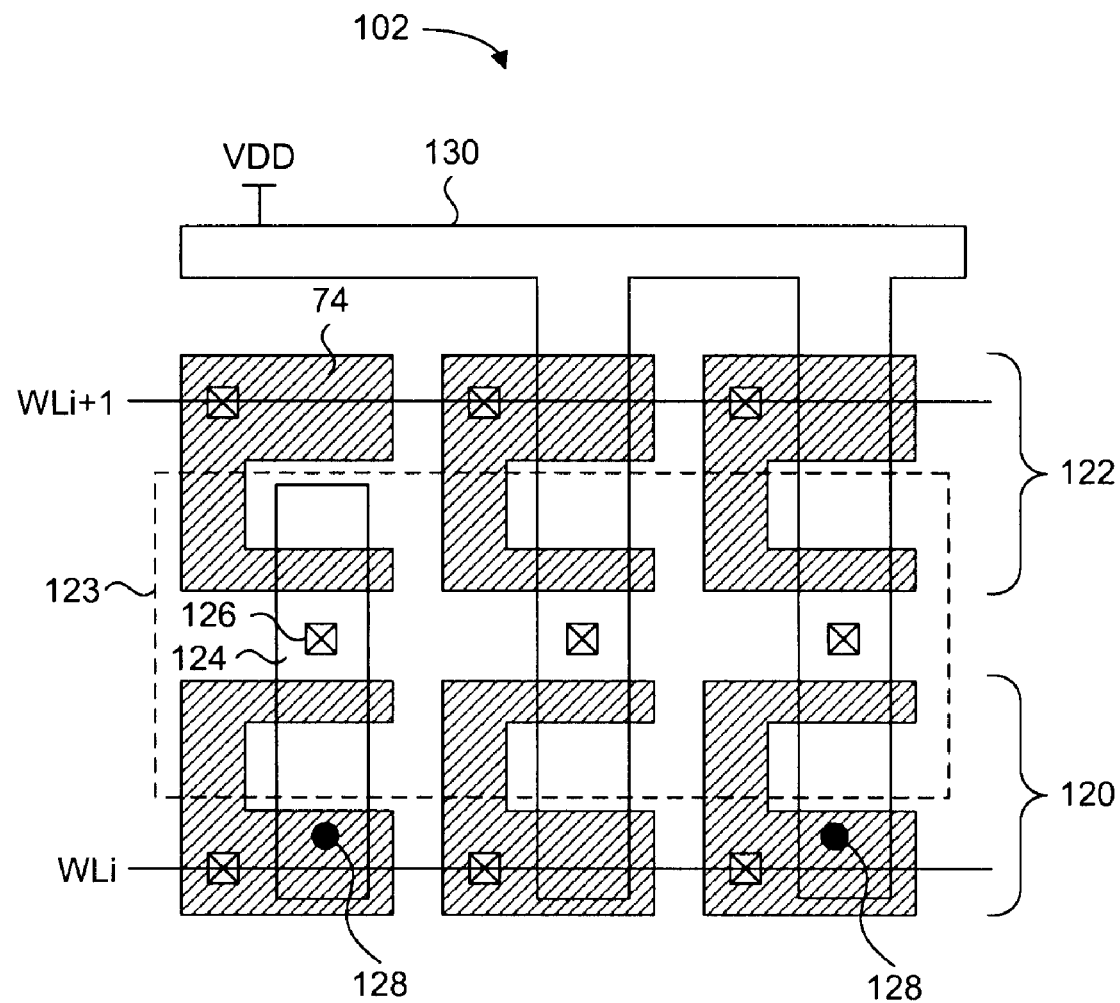
FIG. 7b is a plan view layout showing a hybrid memory array having two-transistor one-time programmable memory cells and two-transistor mask programmed memory cells, according to an alternate embodiment of the present invention.

In the embodiment of FIG. 7a, only the diffusions of anti-fuse memory cells to be programmed with a particular state are mask programmed to be coupled to the VDD coupled diffusion line 130, while anti-fuse memory cells storing the opposite state remain unmodified. In the alternate embodiment of FIG. 7b, further mask programming is applied to those memory cells storing the opposite state. As shown in FIG. 7b, the left-most mask programmed memory cell of row 122 is mask programmed such that there is no channel region beneath polysilicon gate, such as polysilicon gate 74 shown in FIG. 5a. In other words, the channel region is omitted or absent from underneath the polysilicon gate during fabrication. This will help prevent the mask programmed memory cells from accidental electrical programming. The prevention of accidental electrical programming is further enhanced by adjusting the common diffusion region shape, such as common diffusion region 72 of FIG. 5a, so that it is spaced from the edge of the polysilicon gate 74. Accordingly, the mask programmed memory cells of row 122 have substantially the predetermined layout as the memory cells of row 120, where the only difference is the presence or absence of the channel region and connection to the VDD diffusion line 130.

Figure 7C:
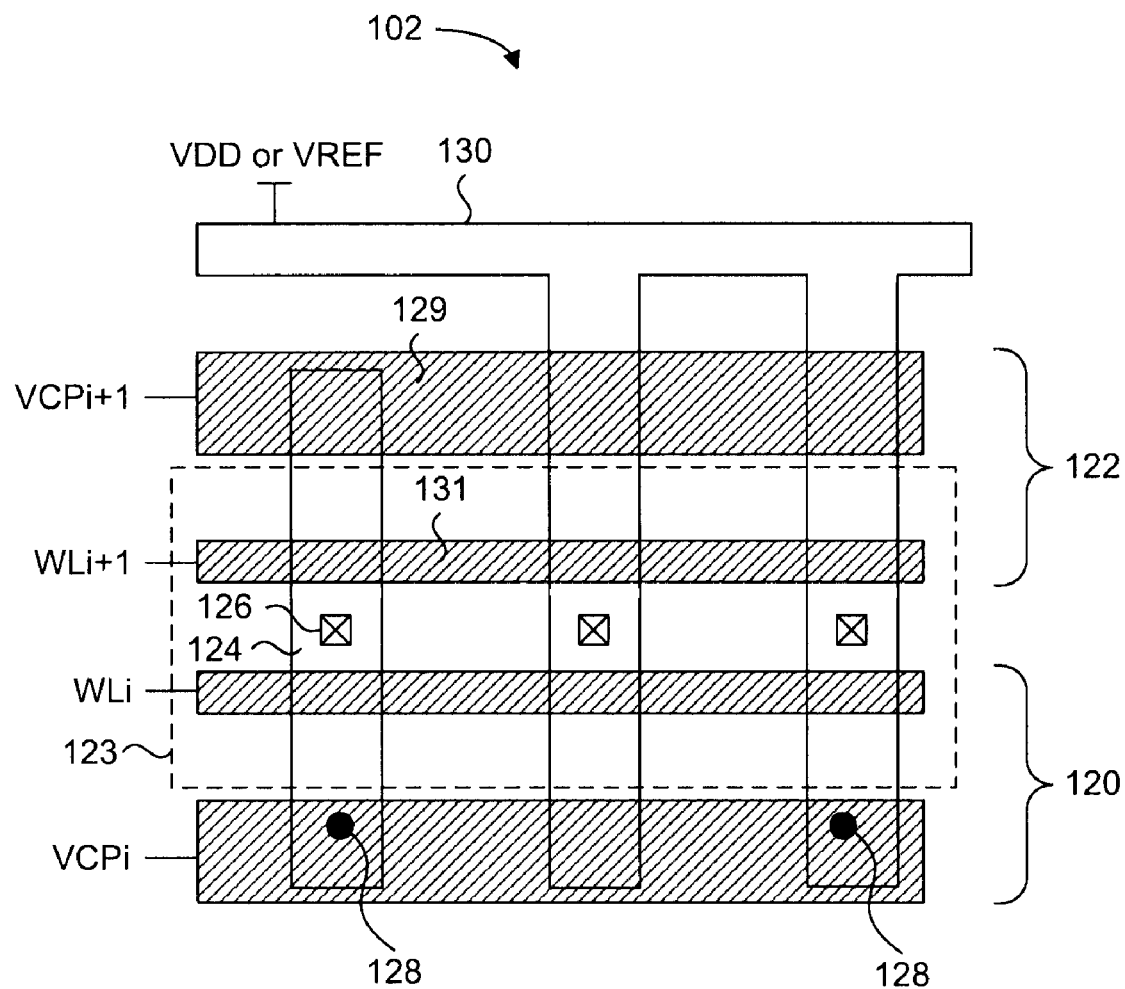

FIG. 7c shows an alternate embodiment of the hybrid memory array shown in FIG. 7a. In the embodiment of FIG. 7c, memory cells 120 and 122 share a common polysilicon cell plate 129 carrying a cell plate voltage VCP and a common polysilicon wordline 131 carrying a wordline signal WL. The only difference in operation relative to the embodiment of FIG. 7a is that a programming operation is executed by driving VCP to a high voltage programming level and turning on the corresponding wordline to couple the VSS biased bitline to the shared diffusion area adjacent to the cell plate 129. A read operation is executed by biasing VCP to a positive voltage level while applying a read voltage to the selected wordline WL. It is further noted that the diffusion line 130 can be coupled to VDD or to a reference voltage VREF or VSS in case of the memory cell array with PMOS transistors.

Figure 7D:
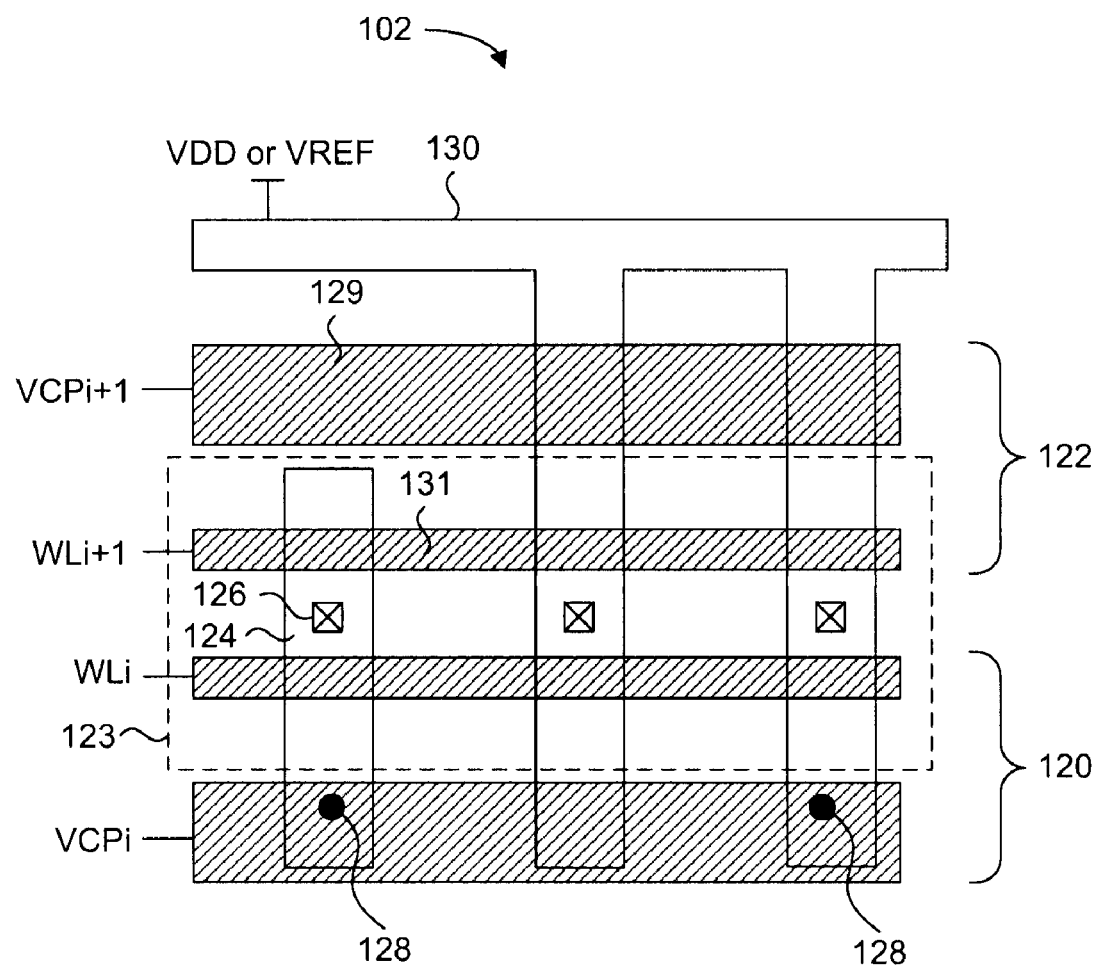
FIG. 7d is a plan view layout showing a hybrid memory array having alternate two transistor one-time programmable memory cells and two-transistor mask programmed memory cells, according to the alternative mask programming technique of FIG. 7b.

FIG. 7d shows an alternate embodiment of the hybrid memory array shown in FIG. 7b. In the embodiment of FIG. 7d, memory cells 120 and 122 share a common polysilicon cell plate 129 carrying a cell plate voltage VCP and a common polysilicon wordline 131 carrying a wordline signal WL. This is similar to the previously shown embodiment of FIG. 7c, with the further modification where further mask programming is applied to those memory cells storing the opposite state. As shown in FIG. 7d, the left-most mask programmed memory cell of row 122 is mask programmed such that there is no channel region beneath polysilicon gate 129. In other words, the channel region is omitted or absent from underneath the polysilicon gate 129 during fabrication.

Figure 8A:
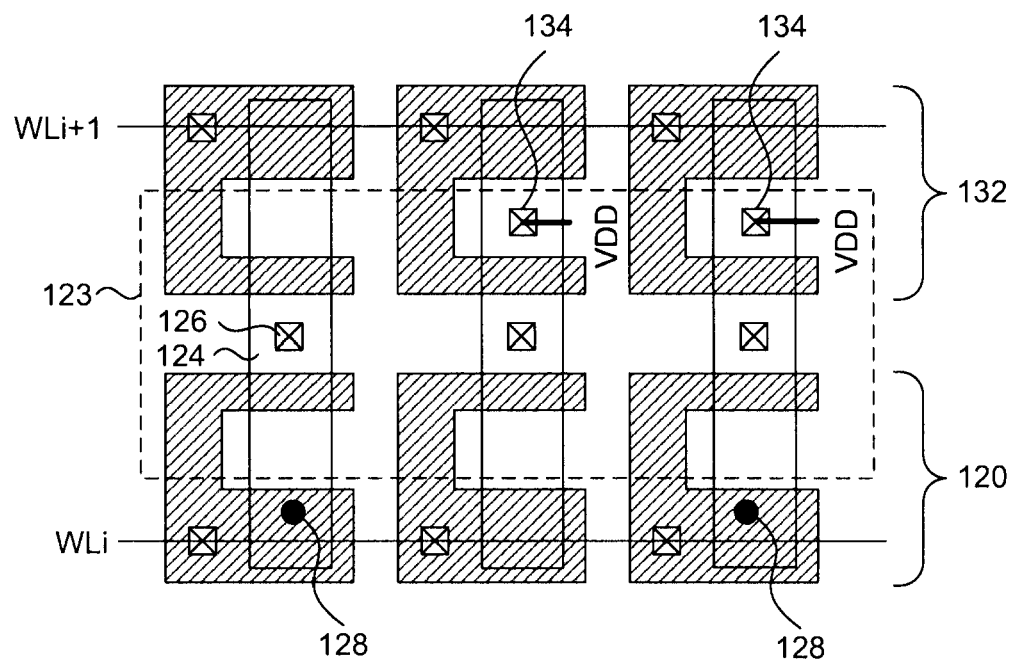
FIG. 8a is the plan view layout showing a hybrid memory array illustrating an alternate mask programming technique.
Figure 8B:
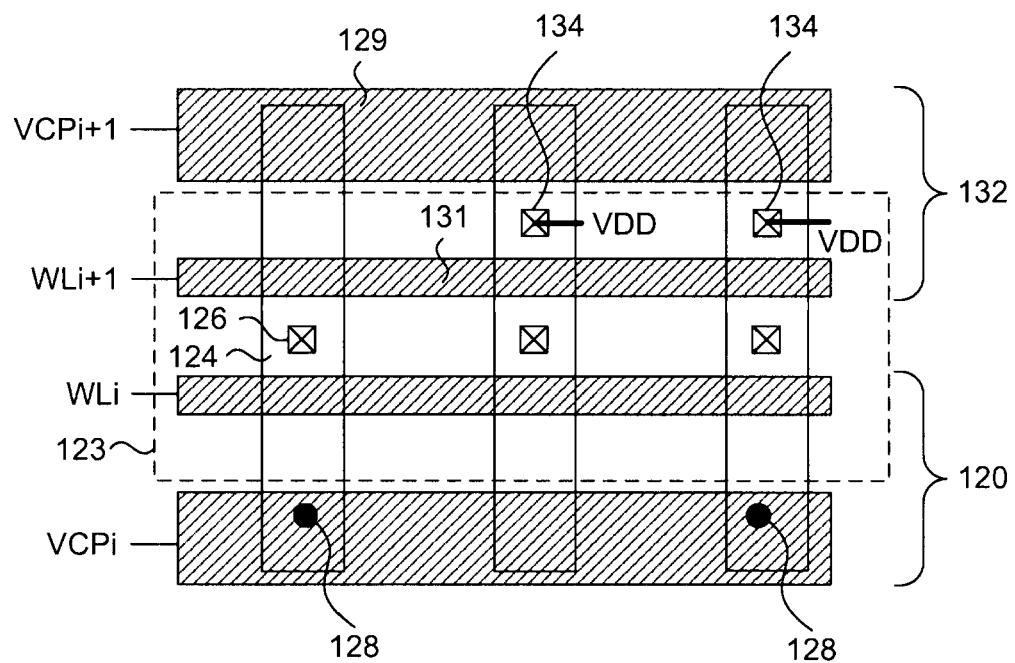

FIG. 8a shows the plan view layout of FIG. 7a, where the two transistor mask programmed memory cells are programmed using an alternative mask programming technique. The row of memory cells 122 is now replaced with a row of mask programmed memory cells 132, which are identically configured to the one-time programmable memory cells of row 120. Instead of adding a diffusion region of the mask programmed memory cells, the contact/via mask can be modified to place metal VDD contacts 134 in the common diffusion region 72 between the two polysilicon gates of the memory cells of row 132. If required, other overlying metal masks can be suitably modified to ensure that the VDD voltage supply is coupled to contacts 134. During a read operation, a memory cell of row 132 having a VDD contact 134 will couple its corresponding bitline to VDD when the wordline WLi+1 is raised to VDD. In contrast, a memory cell of row 132 with an absence of the VDD contact 134 cannot couple its corresponding bitline to VDD, thereby resulting in no effect on the bitline. FIG. 8b shows the plan view layout of FIG. 7c, where the two transistor mask programmed memory cells are programmed using the alternative mask programming technique shown in FIG. 8a.

Figure 4A:
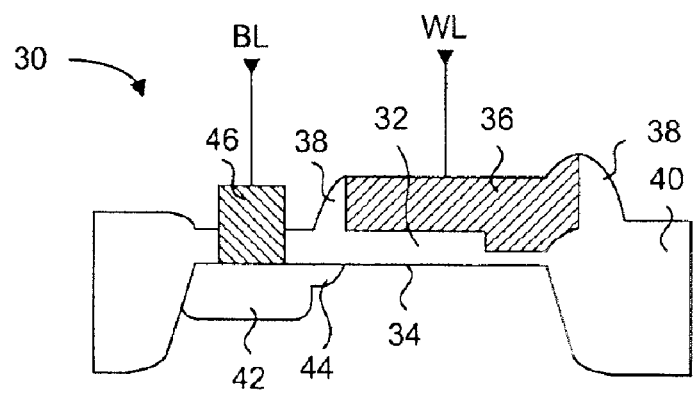
FIG. 4a is a cross-sectional view of a variable thickness gate oxide anti-fuse transistor.
Figure 4B:
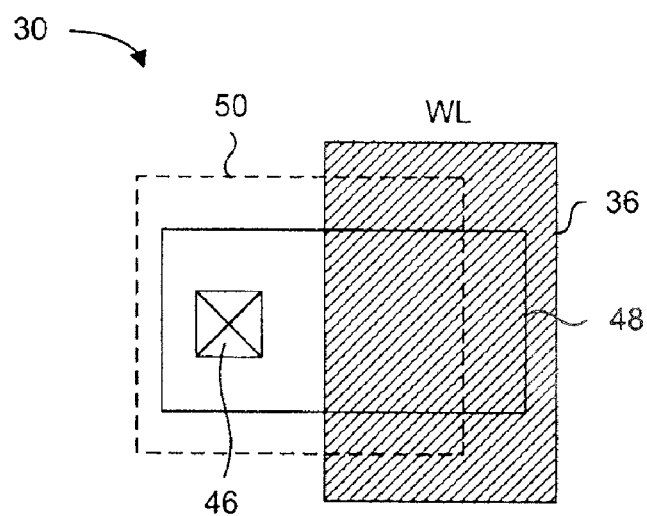
Figure 9A:
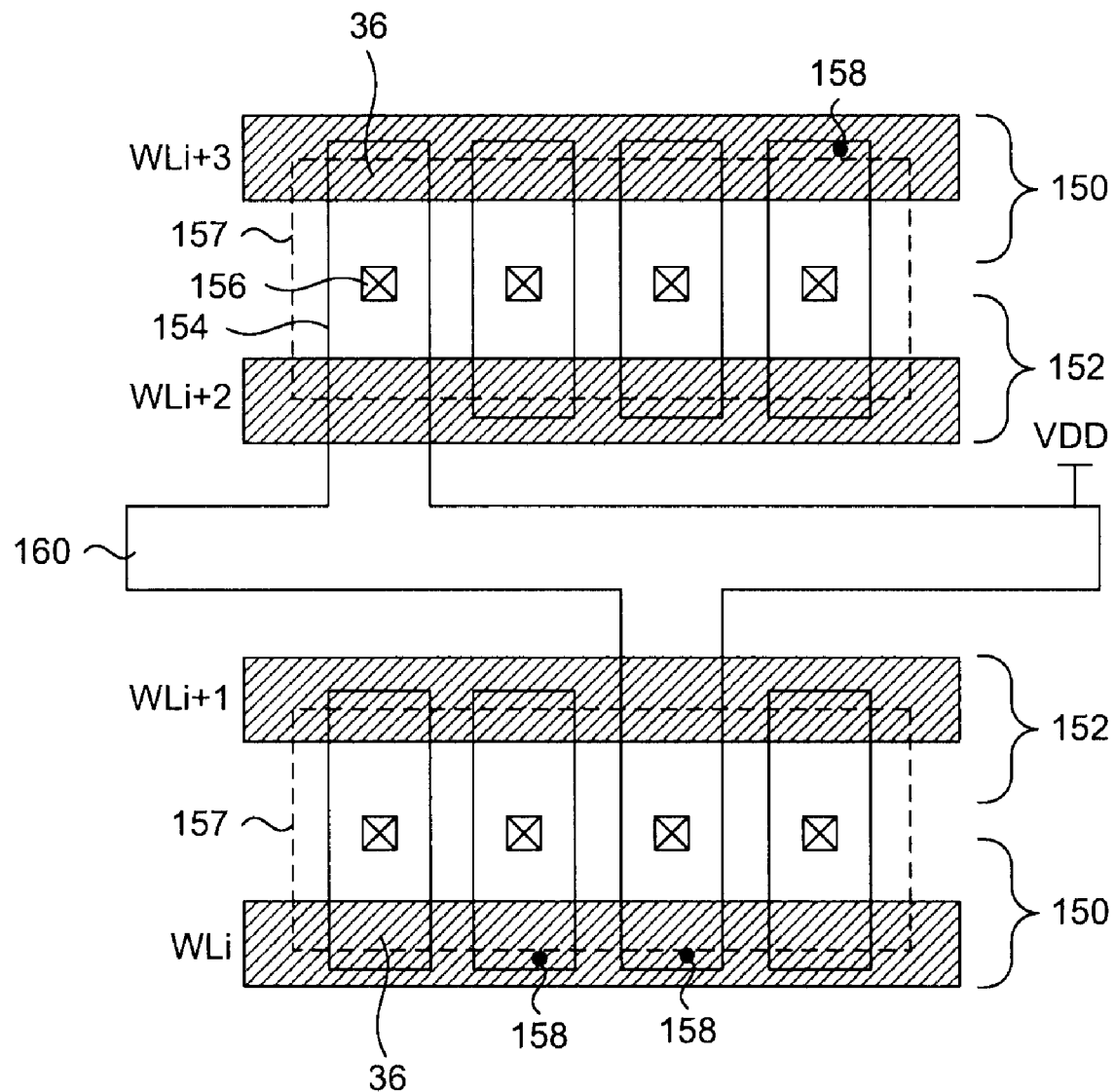
FIG. 9a is a plan view layout showing a hybrid memory array having single transistor one-time programmable memory cells and single transistor mask programmed memory cells, according to an embodiment of the present invention.

FIG. 9a is a plan view layout of a portion of the memory array 102 of FIG. 6 illustrating the integration of single transistor one-time programmable memory cells and single transistor mask programmed memory cells, according to another embodiment of the present invention. In the present example, a first and fourth rows 150 of memory cells connected to wordlines WLi and WLi+3 respectively, are one-time programmable memory cells. A second and third rows 152 of memory cells connected to wordlines WLi+1 and WLi+2 respectively, are mask programmed memory cells. Each memory cell of rows 150 and 152 are single transistor anti-fuse memory cells having the same predetermined layout as shown in FIGS. 4a and 4b and the same gate oxide structure. The gate oxide structure refers to the variable thickness gate oxide composition of the anti-fuse transistor. In the configuration shown in FIG. 9a, each pair of memory cells of rows 150 and 152 share a common diffusion region 154 and common bitline contact 156. The dashed outlines 157 defines the areas in which the thick gate oxide is to be formed via an OD2 mask during the fabrication process, and is analogous to dashed outline 50 shown in FIG. 4b. In the present example, one-time programmable memory cells of rows 150 are electrically programmable, and may or may not have a fuse link 158 formed when a programming voltage on WLi and WLi+3 is applied while the corresponding bitlines are biased to ground, VSS or some other sufficiently low voltage level effective for creating fuse link 158 in the presence of the program voltage. During a read operation for example, WLi is driven to VDD and any memory cell of rows 150 having a fuse link 158 will couple VDD from WLi to its corresponding bitline. Any memory cell of rows 150 without a fuse link 158 will not have any effect on its corresponding bitline.

The mask programmed cells of rows 152 are programmed by connecting the source diffusion to a high voltage level such as VDD to create the source-drain path for VDD, via the channel region underneath the variable thickness gate oxide of the memory cell, such as variable thickness gate oxide 32 shown in FIG. 4a. The connection is easily made by modifying the diffusion mask to add/extend diffusion regions to the selected memory cells of rows 152 to connect with a VDD coupled diffusion line 160. During a read operation, a memory cell of row 152 with the diffusion region will couple its corresponding bitline to the VDD coupled diffusion line 160 when the wordline WLi+1 is raised to VDD. In contrast, a memory cell of row 152 with an absence of the diffusion region cannot couple its corresponding bitline to the VDD coupled diffusion line 160, thereby resulting in no effect on the bitline. Therefore, the reading method for the memory cells of rows 150 and 152 is the same since the memory cells of rows 150 having a fuse link 158 behave like a memory cell of rows 152 having the diffusion region connected to the VDD diffusion line 160, and vice versa.

Figure 9B:
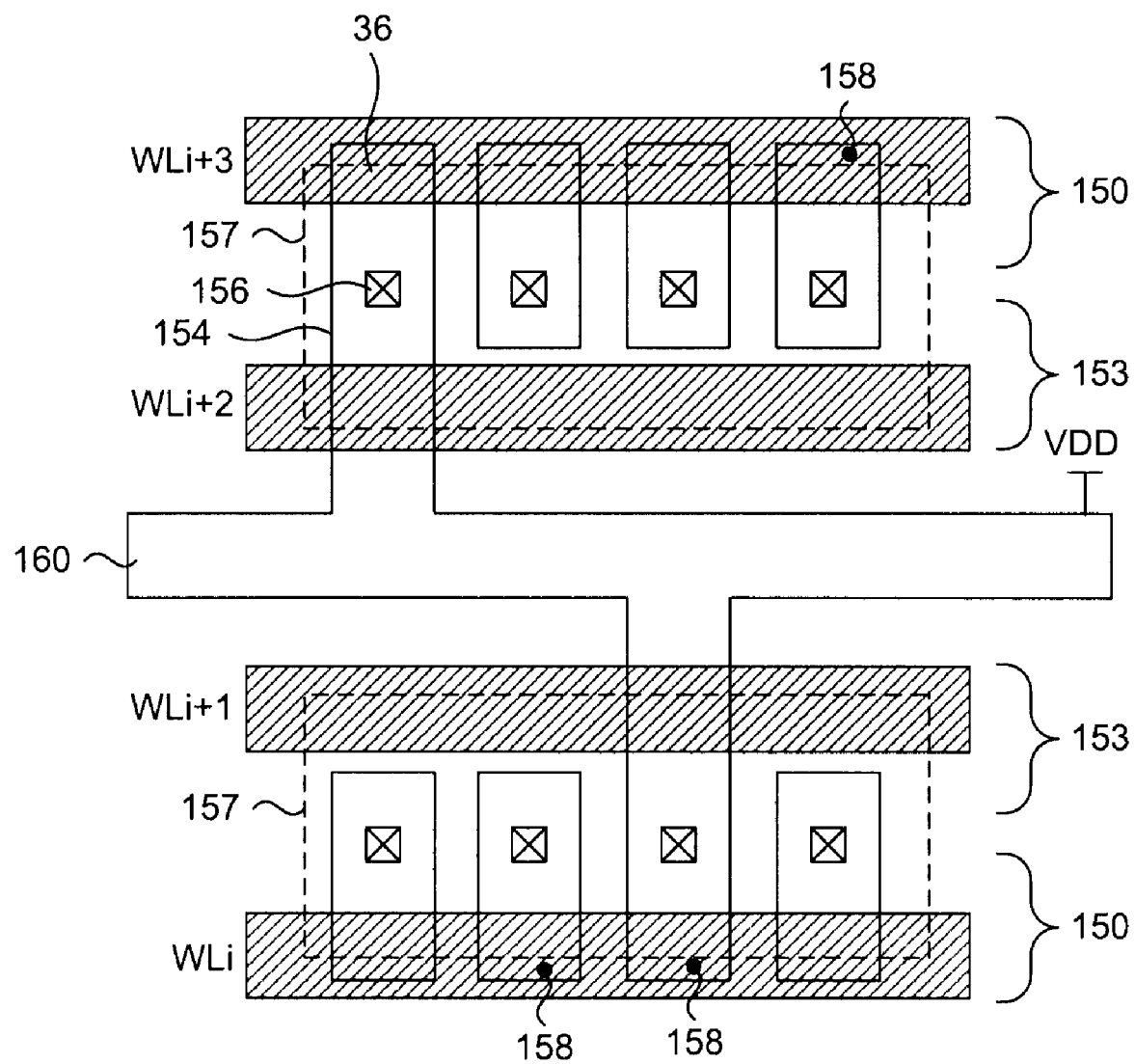
FIG. 9b is a plan view layout showing an alternate hybrid memory array, according to an embodiment of the present invention.

FIG. 9b is an alternate plan view layout of the hybrid memory array of FIG. 9a, according to another embodiment of the present invention. In the embodiment of FIG. 9a, only the diffusions of anti-fuse memory cells to be programmed with a particular state are mask programmed to be coupled to the VDD coupled diffusion line 160, while anti-fuse memory cells storing the opposite state remain unmodified. In the present embodiment, further mask programming is applied to those memory cells storing the opposite state. As shown in FIG. 9b, mask programmed memory cells of rows 153 are programmed to store the opposite state to that of the memory cell coupled to common diffusion 154, such that there is no overlap between the polysilicon gate of wordline WLi+2 and the diffusion region. In other words, instead of extending the common diffusion region 154, the common diffusion region and the channel region is omitted or absent from underneath polysilicon gate. This will further help prevent the mask programmed memory cells from accidental electrical programming. The prevention of accidental electrical programming is further enhanced by forming the common diffusion region 154 so that it is spaced from the edge of the polysilicon gate, such as polysilicon gate 36 shown in FIG. 4a. Accordingly, the mask programmed memory cells of rows 153 have substantially the predetermined layout as the memory cells of rows 150, the only difference being the presence or absence of the channel region and connection to the VDD diffusion line 160.

Figure 10A:
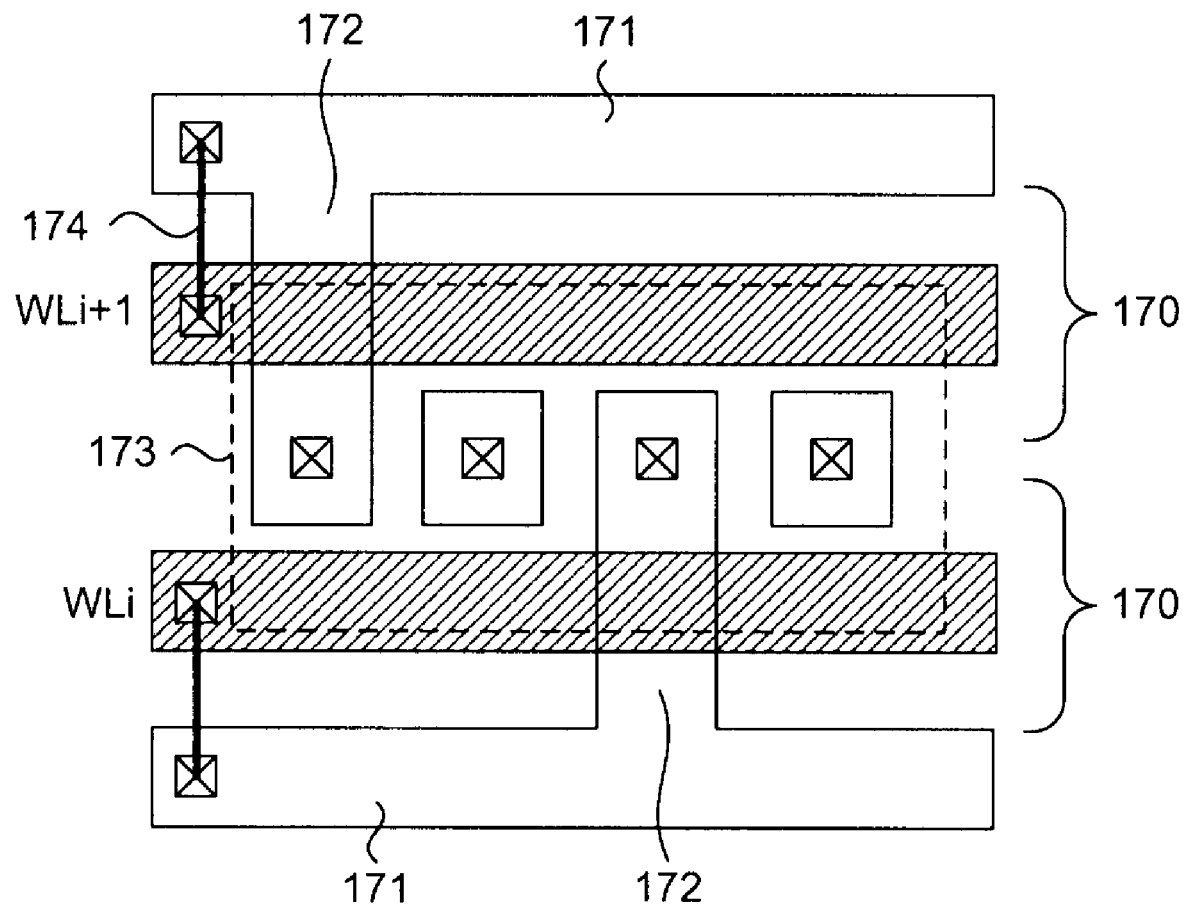
FIG. 10a is a plan view layout of single transistor mask programmed memory cells programmed using an alternative mask programming technique.

FIG. 10a shows the plan view layout of two rows 170 of single transistor mask programmed memory cells programmed using an alternative mask programming technique. Each single transistor mask programmed memory cell of rows 170 is similar to the anti-fuse memory cell shown in FIGS. 4a, 4b and 9a. The dashed outline 173 defines the areas in which the thick gate oxide is to be formed via an OD2 mask during the fabrication process, and is analogous to dashed outline 50 shown in FIG. 4b. Mask programming is achieved by modifying the masks such that the selected memory cells have additional diffusion regions 172 electrically connected to a diffusion line 171, which is in turn coupled to their respective wordline through program couplings 174. Hence, the additional diffusion regions 172 coupled to diffusion line 171 will be formed for those memory cells storing a first logic state. To store a second and opposite logic state, the channel regions under the polysilicon gate can be omitted during fabrication, as previously described for the embodiment of FIG. 9b. In the present embodiment, each program coupling 174 includes a contact formed on the diffusion line 171 and the wordline, and conductive means for electrically connecting them together using one or more available metal layers. During a read operation, WLi is driven to VDD and any memory cell of rows 170 having the additional diffusion region 172 coupled to diffusion line 171 will couple its corresponding bitline to VDD voltage level supplied by the wordline. Of course, this technique can be applied to the two-transistor memory cells shown in FIGS. 7a and 7b.

Figure 10B:
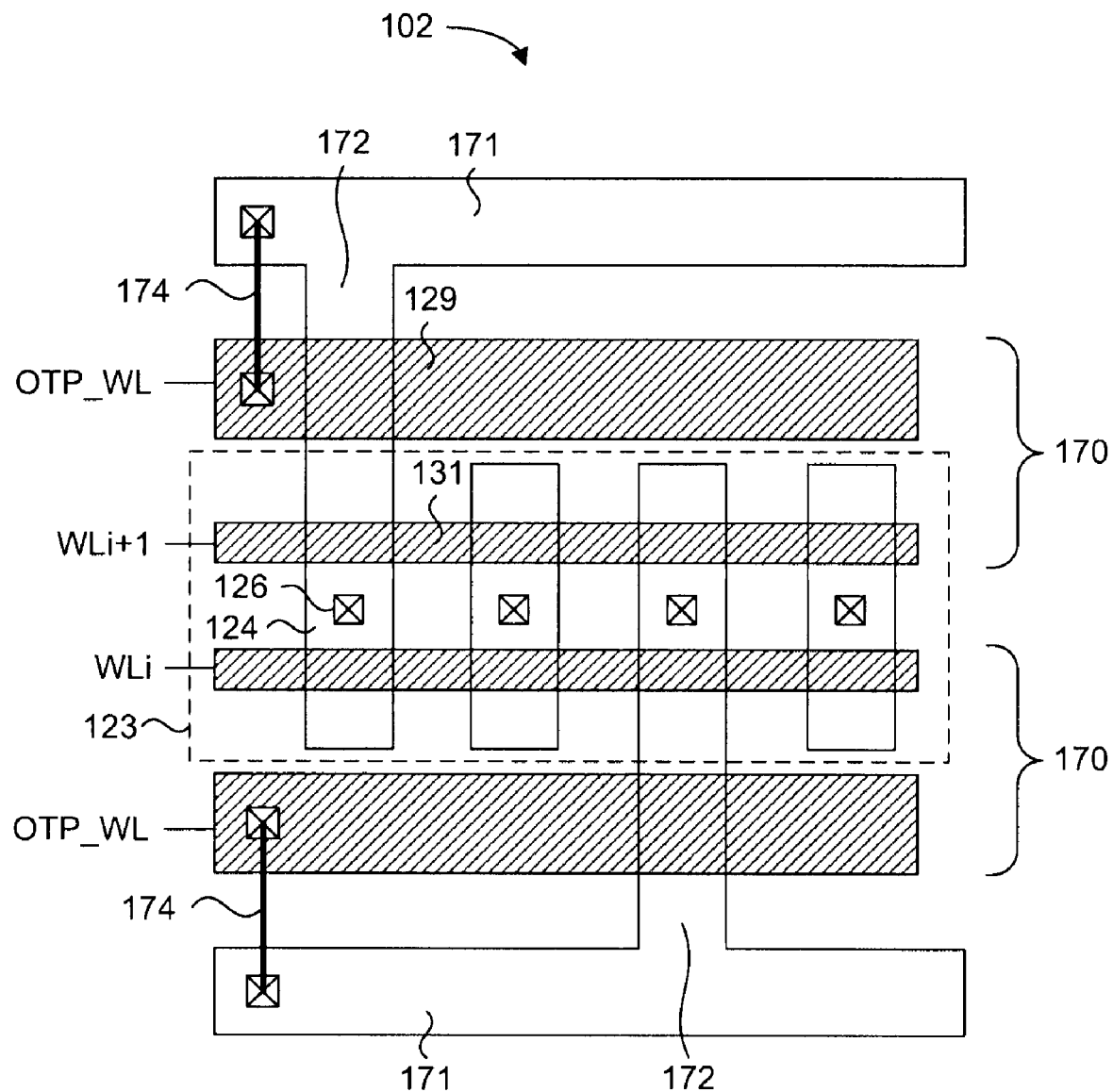

FIG. 10b shows the plan view layout of two rows 170 of the hybrid memory array of FIG. 7d programmed using the alternative mask programming technique shown in FIG. 10a. The polysilicon gate 129 is now referred to as an OTP_WL, which is driven to a positive voltage level during read operations. Therefore, any two transistor cell having the additional diffusion region 172 coupled to the diffusion line 130 will store a first logic state, while any two transistor cell having an absence of a channel region under polysilicon gate 129 will store a second and opposite logic state. While only a single program coupling 174 is shown in the previously shown embodiments, additional program couplings can be included in parallel at predetermined space intervals.

As shown by the previous embodiments, one-time programmable anti-fuse memory cells and mask programmed one-time programmable anti-fuse memory cells can co-exist within the same memory array and be accessed with the same read operation. Furthermore, the one-time programmable anti-fuse memory cells can then be programmed with data by the end user. Depending on the application, the mask programmed data should not be modified either intentionally or accidentally. Since the mask programmed cells in the previously discussed embodiments are still one-time programmable anti-fuse memory cells, they can be programmed when the wordline is driven to the programming voltage and the bitlines are biased to a voltage level effective for programming the anti-fuse memory cell.

Therefore, a program lockout feature is provided for inhibiting programming of any row of memory cells, which can include mask programmed anti-fuse memory cells or one-time programmable anti-fuse memory cells. The hybrid one-time programmable and mask programmed memory shown in FIG. 6 included a program lock circuit block 110 for executing this feature of the present invention. The program lockout feature provides physical security to ensure that mask programmed data cannot be modified, and can be used to lock out any number of one-time programmable rows which may be deemed to be defective during testing.

Figure 11:
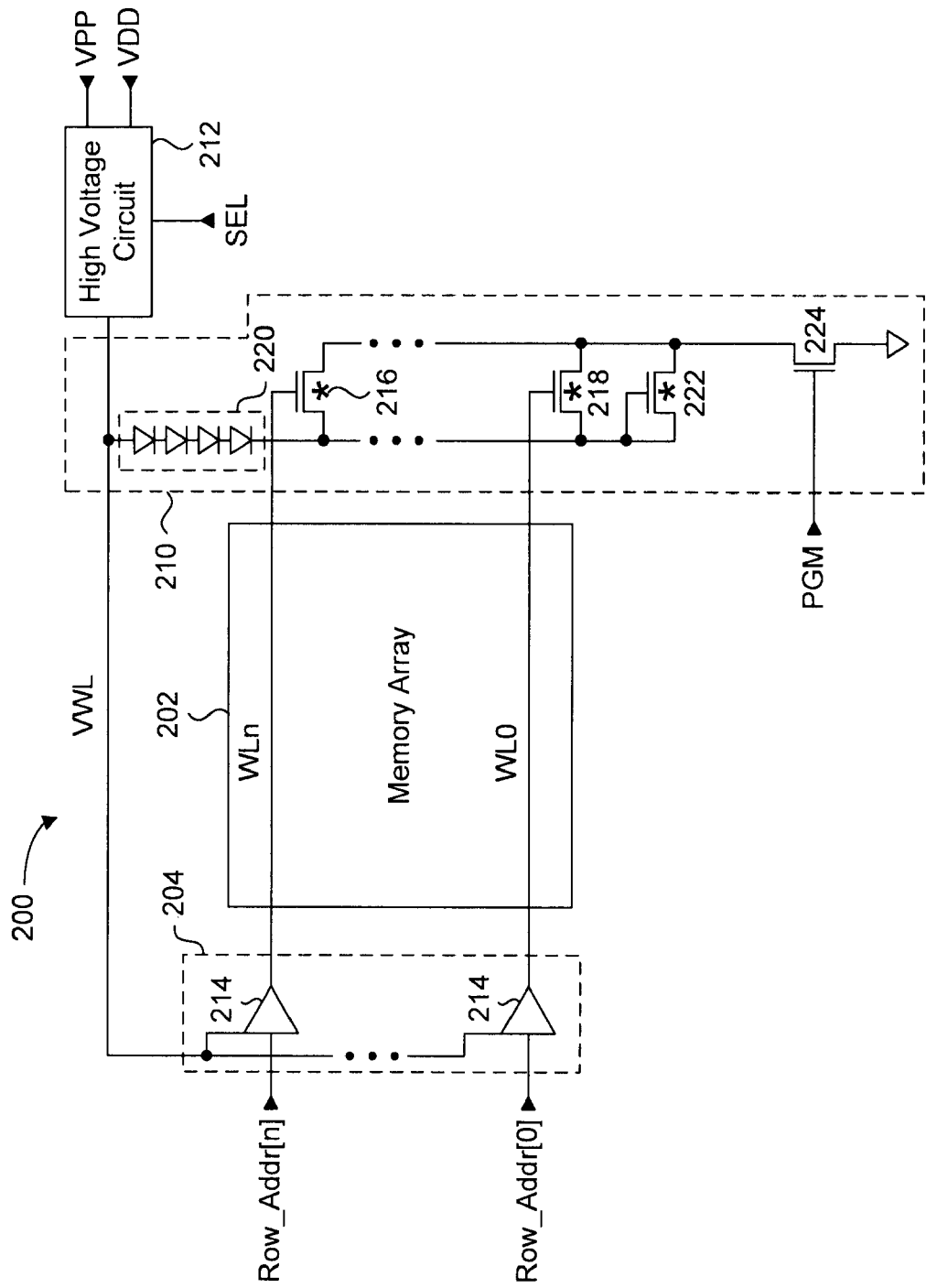
FIG. 11 is a block diagram of a hybrid memory showing circuit details of a program lock circuit according to an embodiment of the present invention.

Referring to FIG. 6, the program lock circuit block 110 will include mask programmable circuit elements coupled to each wordline for automatically inhibiting programming of any anti-fuse memory cells connected to it when a wordline driver of wordline driver circuit block 104 applies a programming voltage. More specifically, the program lock circuit block 110 will inhibit programming by adjusting the programming voltage to a level ineffective for inducing programming in the anti-fuse memory cell if the mask programmable circuit element has been programmed to a specific state. FIGS. 11 and 12 illustrate example embodiments of the program lock circuit block 110.

FIG. 11 is a block diagram of a hybrid memory with a program lock circuit, according to an embodiment of the present invention. Hybrid memory 200 includes the same circuit blocks as shown in the hybrid memory 100 of FIG. 6. Hybrid memory 200 includes a memory array 202, a wordline driver circuit block 204, a program lock circuit block 210 and a high voltage switch circuit 212. For clarity, a column decoder circuit block and a sense amplifier circuit block are not shown as they are not relevant to the present embodiment. The memory array 202 includes rows and columns of the same type of memory cells, such as the anti-fuse memory cells shown in FIGS. 4a to 5b, where each row of memory cells is connected to a respective wordline. Each row can either be mask programmed during fabrication or ready to be electrically programmed. Wordline driver circuits 214 apply a wordline voltage VWL to wordlines WL0 to WLn (where n is an integer value greater than 0) when selected in response to a decoded row address signal such as Row_Addr[0] and Row_Addr[n].

Wordline voltage VWL is controlled by high voltage switch circuit 212 that receives both the regular positive voltage supply VDD and a programming voltage VPP. High voltage switch circuit 212 will drive VWL with VDD in response to a first state of selection signal SEL and will drive VWL with VPP in response to a second state of selection signal SEL. The first state can be set when a read operation is being executed, while the second state can be set when a programming operation is being executed. It is during the programming operations that the program lock circuit block 210 will be automatically enabled. The program lock circuit block 210 includes mask programmable inhibit circuits for disabling the programming voltage, which in the present embodiment, includes mask programmable transistors 216 and 218 connected in parallel to the VWL line via a voltage drop circuit 220 consisting of a series of diodes. An optional diode configured mask programmable master lock transistor 222 is included in the present embodiment. The gate terminal of each mask programmable transistor 216 and 218 is coupled to a respective wordline, as shown in FIG. 11. The source terminals of mask programmable transistors 216, 218 and 222 are connected in parallel to a common node and grounding transistor 224. Grounding transistor 224 behaves as an enabling circuit for program lock circuit 210.

The mask programmable transistors 216, 218 and 222 will either have a channel region formed between its drain and source terminals or an absence of a channel region. Any wordline coupled to a mask programmable transistor formed with a channel, such as mask programmable transistor 218, is considered to be a row of memory cells locked from being programmed. Any wordline coupled to a mask programmable transistor formed without a channel, such as mask programmable transistor 216, is considered to be a row of memory cells that are programmable. The mechanism through which programming of a row of memory cells is inhibited will now be described.

It is presumed that the desired rows are locked from being programmed during fabrication by mask programming the mask programmable transistors of the program lock circuit block 210. During normal use of the memory 200, and in particular during a program operation, SEL will control high voltage switch circuit 212 to drive VWL to the VPP voltage level. The selected row is activated by having a wordline driver circuit 214 drive its respective wordline with VWL at the VPP level in response to an active decoded row address signal. During a programming operation signal PGM is driven to the high logic level to connect the source terminals of mask programmable transistors 216, 218 and 222 to VSS. Any VPP driven wordline coupled to a mask programmable transistor having a channel region, such as mask programmable transistor 218, will turn it on to couple VWL to VSS through the voltage drop circuit. The voltage level of VWL will then be reduced to a voltage level insufficient for programming any of the anti-fuse memory cells in the memory array 202. On the other hand, if the VPP driven wordline is coupled to a mask programmable transistor having no channel region, such as mask programmable transistor 216, no conduction path to VSS is formed. Therefore, the anti-fuse memory cells connected to the VPP driven wordline can be programmed as VWL remains at the VPP level. The program lock circuit block 210 uses a feedback mechanism for automatically locking a row from being programmed by adjusting VWL from a programming voltage level to a non-programming voltage level during programming. No logic is required in the present embodiment of the program lock circuit block 210.

During a read operation, PGM will be at the low logic level to disable program lock circuit block 210, and therefore has no effect during read operations. As previously mentioned, an optional mask programmable master lock transistor 222 is provided for locking all rows of memory array 202 from being programmed. If programmed to include a channel region, transistor 222 will automatically discharge VWL towards VSS as soon as VWL is driven to VPP in a programming operation. This feature allows for simplified locking of all rows by mask programming a single transistor, instead of mask programming all the mask programmable transistors coupled to each wordline.

Figure 12A:
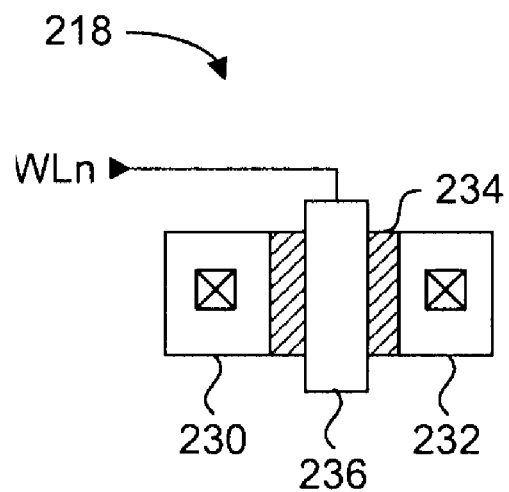
FIG. 12a is an example embodiment of a mask programmable transistor shown in FIG. 11.

As previously mentioned, the mask programmable transistors used in program lock circuit block 210 can be mask programmed to include or omit a channel region. FIG. 12a is an example embodiment of mask programmable transistor 218 shown in FIG. 11. Mask programmable transistor 218 has a drain region 230, a source region 232, an optional channel region 234, and a polysilicon gate 236 coupled to wordline WLn. During mask programming, transistor 218 can be formed with our without the optional channel region 234, such that there is a permanent open circuit connection between drain region 230 and source region 232. The length of optional channel region 234 can be greater than or less than the length of polysilicon gate 236.

Figure 12B:
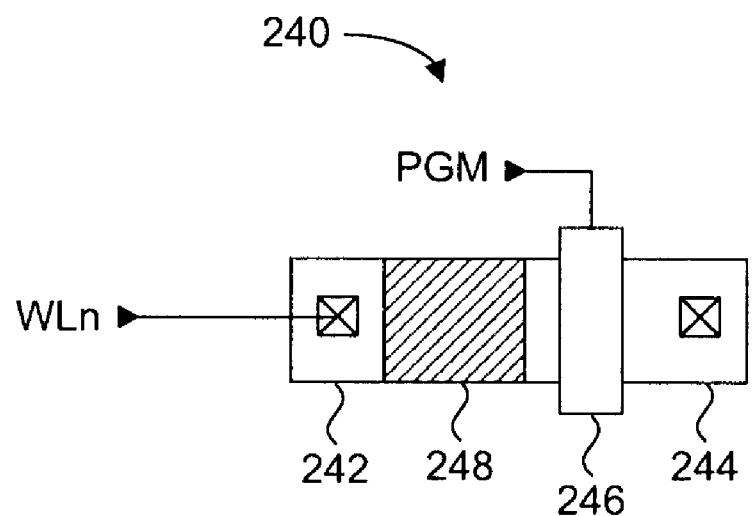
FIG. 12b is an example embodiment of an alternate mask programmable transistor.

FIG. 12b is an example embodiment of an alternate mask programmable transistor. Mask programmable transistor 240 has a drain region 242 coupled to WLn, a source region 244, a polysilicon gate 246 coupled to program signal PGM and overlying a channel region (not shown), and optional diffusion area 248. In the present embodiment, the source region 244 is electrically connected to VSS, such that when PGM is driven to the high logic level during a programming operation, WLn is coupled to VSS if the optional diffusion area 248 is included during mask programming. On the other hand, if the optional diffusion area 248 is omitted during fabrication, then WLn can never be coupled to VSS through mask programmable transistor 240. The optional diffusion area 248 can be included or omitted from the source region 244 instead of from the drain region 242. In another alternate mask programming technique, an optional contact or via connection can be formed between the wordline and drain region 242 in order to lock the corresponding row of cells from being programmed. The presences of an optional contact or via will have the same effect as including the optional diffusion area 248.

The previously discussed mask programming technique of including or omitting an optional diffusion area can be applied to the mask programmable transistor 218, while the optional channel region mask programming technique can be applied to the mask programmable transistor 240.

The program lock circuit of FIG. 11 will prevent programming of locked rows, where a locked row has an inhibit circuit, or device, mask programmed during fabrication to directly discharge the VPP driven VWL line to a voltage level ineffective for programming the anti-fuse memory cells. According to another embodiment of the invention, the program lock circuit is configured to override the high voltage switch circuit.

Figure 13:
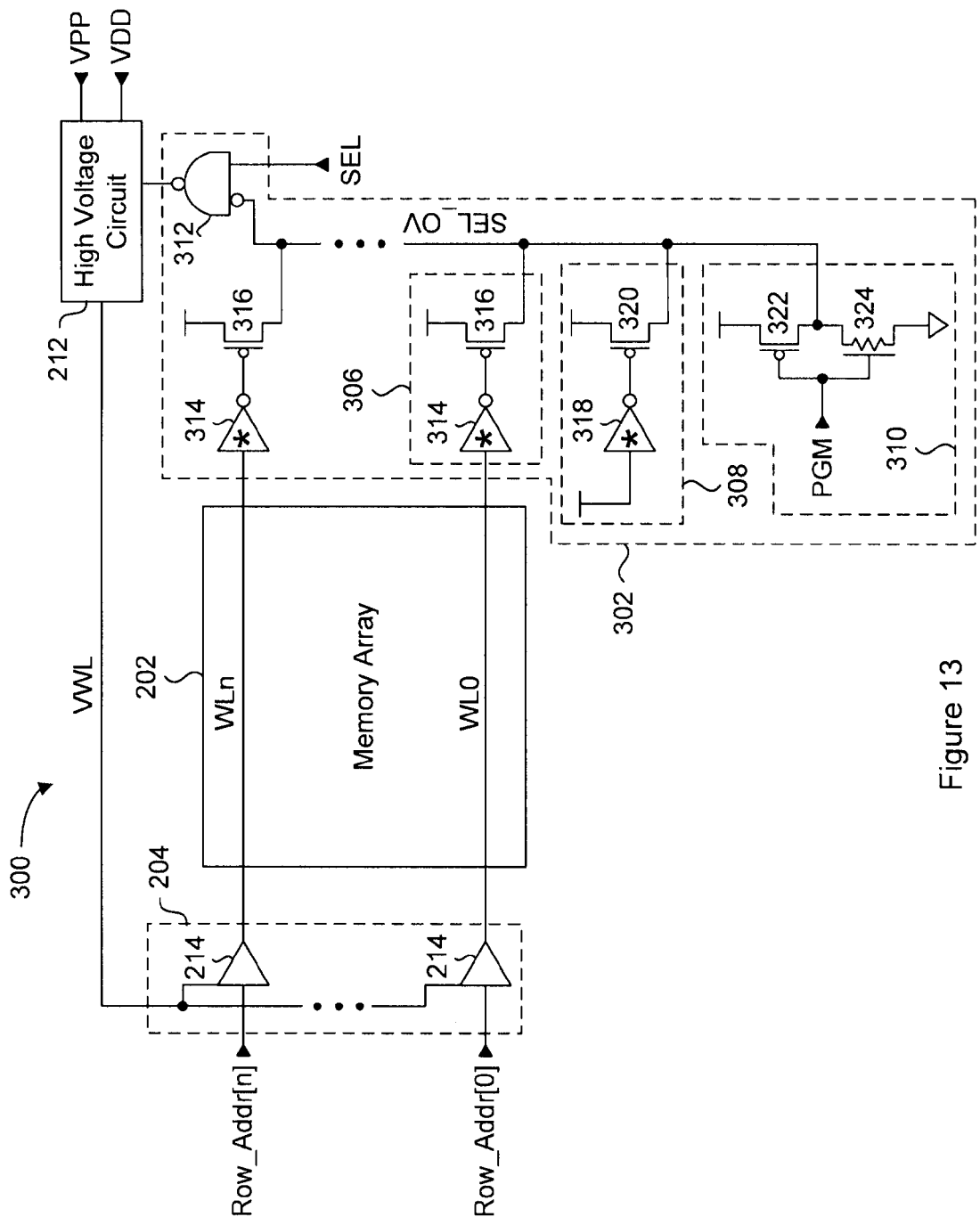
FIG. 13 is a block diagram of a hybrid memory with such a program lock circuit, according to another embodiment of the present invention.

FIG. 13 is a block diagram of a hybrid memory with such a program lock circuit, according to another embodiment of the present invention. Hybrid memory 300 includes the same memory array 202, wordline driver circuit block 204, high voltage switch circuit 212 and wordline driver circuits 214 shown in hybrid memory 200 of FIG. 11. The program lock circuit 302 uses a logical switching technique for overriding the high voltage switch circuit 304, and more specifically, controls high voltage switch circuit 212 to drive VWL to the read voltage, such as VDD in the event a protected row is accessed for programming. The program lock circuit 302 includes a series of mask programmable inhibit circuits 306, each being coupled to a respective wordline, a master lock circuit 308, an override signal line precharge circuit 310, and override logic 312. Each mask programmable inhibit circuit 306 includes a mask programmable inverter 314 having an input coupled to a respective wordline, and an output connected to the gate of a p-channel pull up activating transistor 316. The pull up transistors 316 are arranged in a wired-OR configuration for coupling VDD to override signal line SEL_OV when the output of a mask programmable inverter 314 is at the low logic level. Any wordline coupled to a mask programmable inverter 314 which has been mask programmed to operate as a normal inverter will be considered to be a row of memory cells locked from being programmed.

The master lock circuit 308 includes a mask programmable inverter 318 having its input connected to VDD and its output coupled to the gate of another pull up transistor 320, which is configured identically to p-channel pull up transistors 316 with respect to override signal line SEL_OV. The function of master lock circuit 308 is the same as mask programmable master lock transistor 222 of FIG. 11. The override signal line precharge circuit 310 is essentially an inverting circuit consisting of p-channel transistor 322 and an n-channel transistor 324 serially connected between VDD and VSS and controlled by signal PGM. The n-channel transistor may be a long channel transistor, or can be a regular n-channel transistor with resistance means in-line between SEL_OV and VSS. In the present embodiment, the inverters are mask programmable during fabrication to either include or omit an optional channel region, or optional diffusion regions. The override logic 312 includes a NAND gate having a first input for receiving selection signal SEL and a second inverting input for receiving SEL_OV. The output of the NAND gate is connected to the input of high voltage switch circuit 212 which had received SEL directly in the embodiment of FIG. 11.

The operation of program lock circuit 302 is as follows. In the present embodiment, is assumed that the output of override logic 312 at the high logic level will cause VDD to be coupled to VWL, while a low logic level output will cause VPP to be coupled to VWL. SEL is set to the low logic level to couple VDD to VWL during a read operation and then to the high logic level to couple VPP to VWL during a programming operation. PGM is set to the low logic level during a read operation, and set to the high logic level during a programming operation. Therefore, during a read operation, the output of override logic 312 will be at the high logic level. During a program operation, PGM is driven to the high logic level to turn on n-channel transistor 324, thereby setting SEL_OV to the low logic level as it is now coupled to VSS. This enables override logic 312 to respond to SEL, which is then set to the high logic level. Accordingly, the output of override logic 312 will change to the low logic level. VWL is driven to VPP and a selected wordline is driven to VPP via its wordline driver circuit 214. If the mask programmable inverter 314 coupled to the driven wordline is mask programmed to operate as a normal inverter for locking the corresponding row, then it will turn on its corresponding pull up transistor 316. Now SEL_OV will be driven to the high logic level, thereby forcing the output of override logic 312 to rise to the high logic level.

In response to the high logic level output of override logic 312, the high voltage switch circuit couples VWL to VDD, which is sufficiently low to inhibit programming of the anti-fuse memory cells of the row. It is noted that the long channel transistor 324, or presence of an in-line resistance means, is selected to have a resistance value effective for allowing pull up transistors 316 to drive SEL_OV to VDD while transistor 324 is turned on. Those skilled in the art will understand that there are different possible logic configurations of override logic 312 which can be used in place of the illustrated NAND gate.

Figure 14:
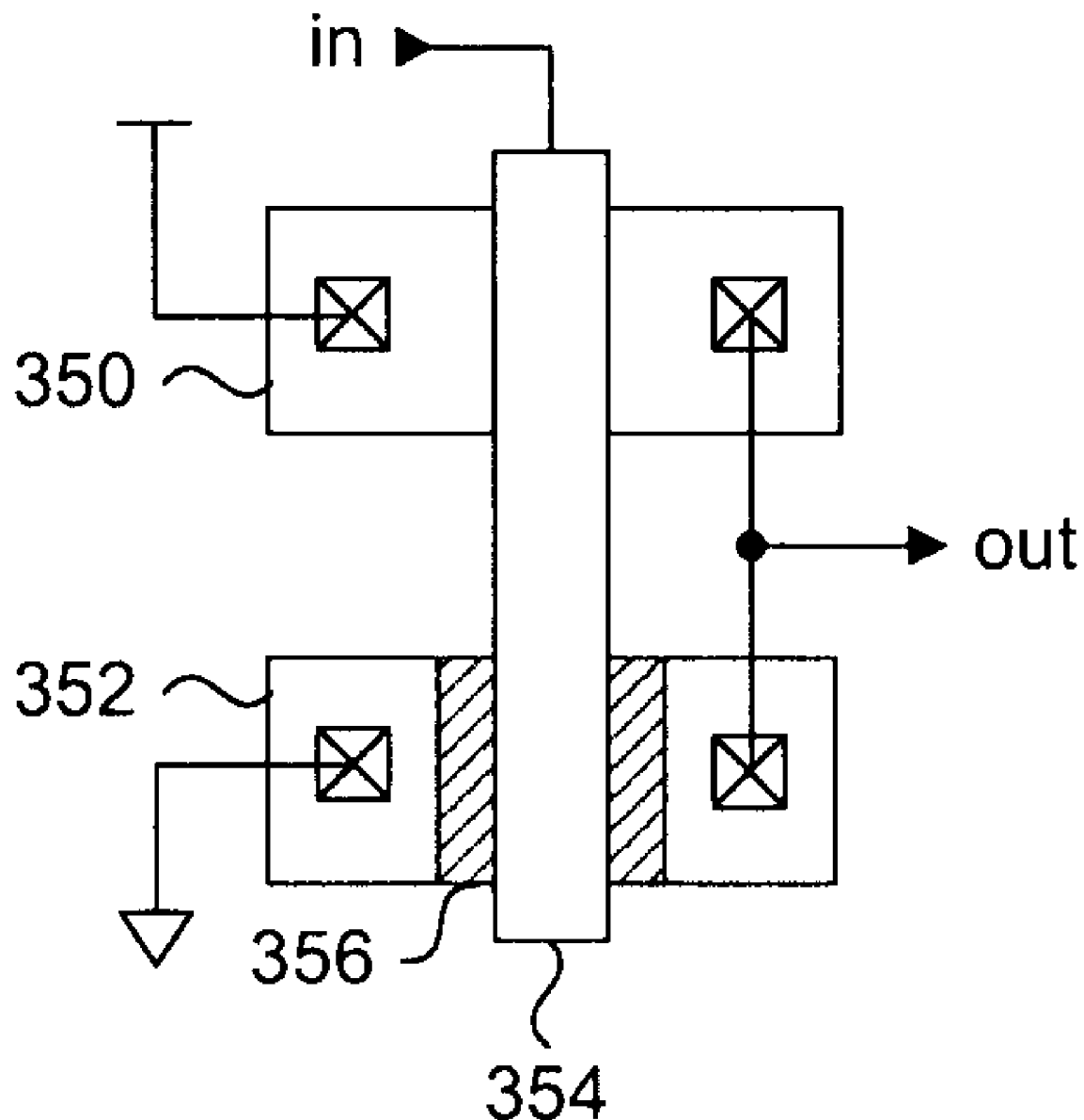
FIG. 14 is an example embodiment of mask programmable inverter shown in FIG. 13.

FIG. 14 is an example embodiment of mask programmable inverter 314 or 318 shown in FIG. 13. Those skilled in the art should be familiar with the illustrated inverter layout. Inverter 314 includes a p-channel transistor 350 and an n-channel transistor 352, having a common polysilicon gate 354 for receiving input signal "in". The source and drain terminals of transistors 350 and 352 are connected together to provide an output signal "out". In the present embodiment where the programming voltage is positive, the n-channel transistor 352 will have an optional channel region 356 which can be included or omitted during fabrication. If the optional channel region 356 is included, then inverter 314 will couple "out" to VSS when "in" is at the high logic level, thereby turning on its corresponding pull up transistor 316. The absence of the optional channel region 356 prevents "out" from being coupled to VSS, thereby keeping its corresponding pull up transistor 316 turned off. It is noted that prior to programming or a read operation, the wordlines are set to VSS, therefore the pull up transistors 316 are turned off because the inverter 314 will provide a high logic level output. The gate of a pull up transistor 316 is thus allowed to float at the high logic level if the optional channel region 356 of inverter 314 is omitted for a selected wordline.

In an alternate embodiment, the mask programmable inverters 314 and 318 are replaced with normal inverters, and the pull up transistors 316 become mask programmable transistors, where either optional diffusion areas or optional channel regions such as those shown in FIGS. 12a and 12b, can be included or omitted via mask programming. Hence, any mask programmable pull up transistor 316 having an optional channel region or diffusion area will lock its corresponding row from being programmed since it can change the logic state of SEL_OV in response to the VPP level of the selected wordline.

The program lock circuit embodiments shown in FIGS. 11 and 13 are effective for preventing accidental programming of mask programmed rows of anti-fuse memory cells. However, for applications where security is required, intentional tampering of the code stored in the mask programmable memory cells can occur. If the program lock circuits are somehow defeated, or there is no program lock circuit available, resulting in the code being modified through successful programming, then there should be some indication to the system or the user that the data stored in the tampered rows are no longer valid. This can be done by including at least one additional column of anti-fuse memory cells within the hybrid memory array.

Figure 15:
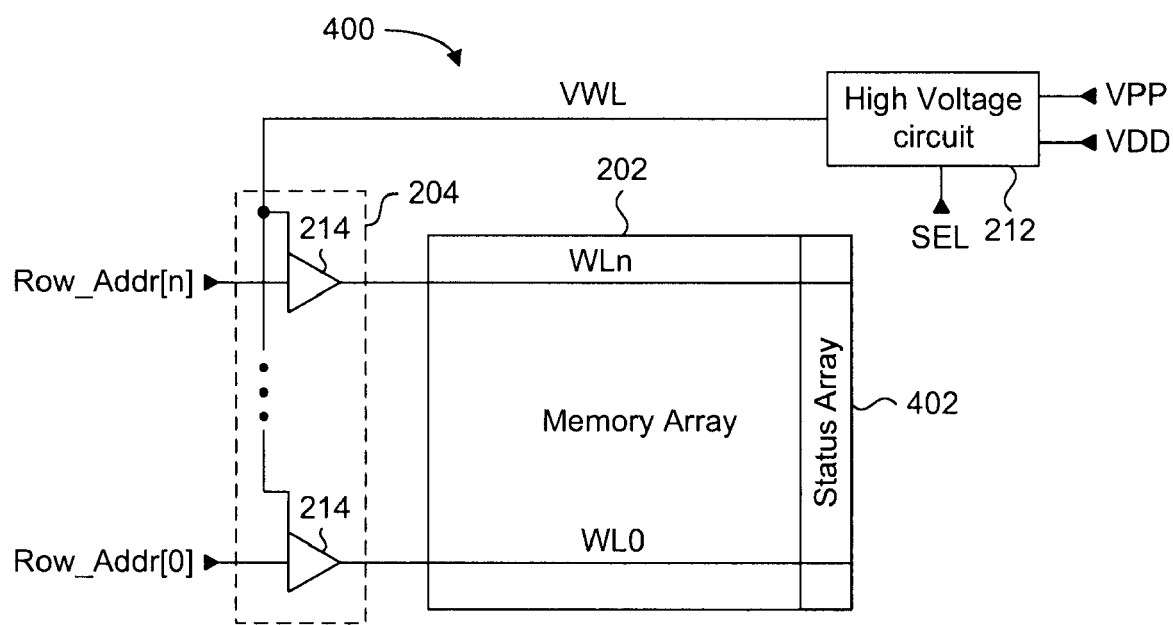
FIG. 15 is a block diagram of a hybrid memory array having a programmable status array.

FIG. 15 is a block diagram of a hybrid memory array having a programmable status array which provides at least one status bit corresponding to each row of the hybrid memory array. The at least one status bit is read at the same time a row of data is ready to indicate the validity of the data. Hybrid memory 400 includes the same circuit elements shown in FIG. 11. Memory array 202 now includes a status array 402 consisting of at least one additional column of electrically programmable anti-fuse memory cells connected to each wordline. In general operation, any row of mask programmed anti-fuse memory cells subjected to a programming voltage, either intentionally or unintentionally, will inherently program the anti-fuse memory cell of the status array 402. Therefore, when that particular row is read, the corresponding programmed memory cell in the status array 402 is read. A programmed status bit will indicate to the system or user that the row has been tampered with, thereby allowing the user to ignore the data as it may no longer be valid.

Figure 16A:
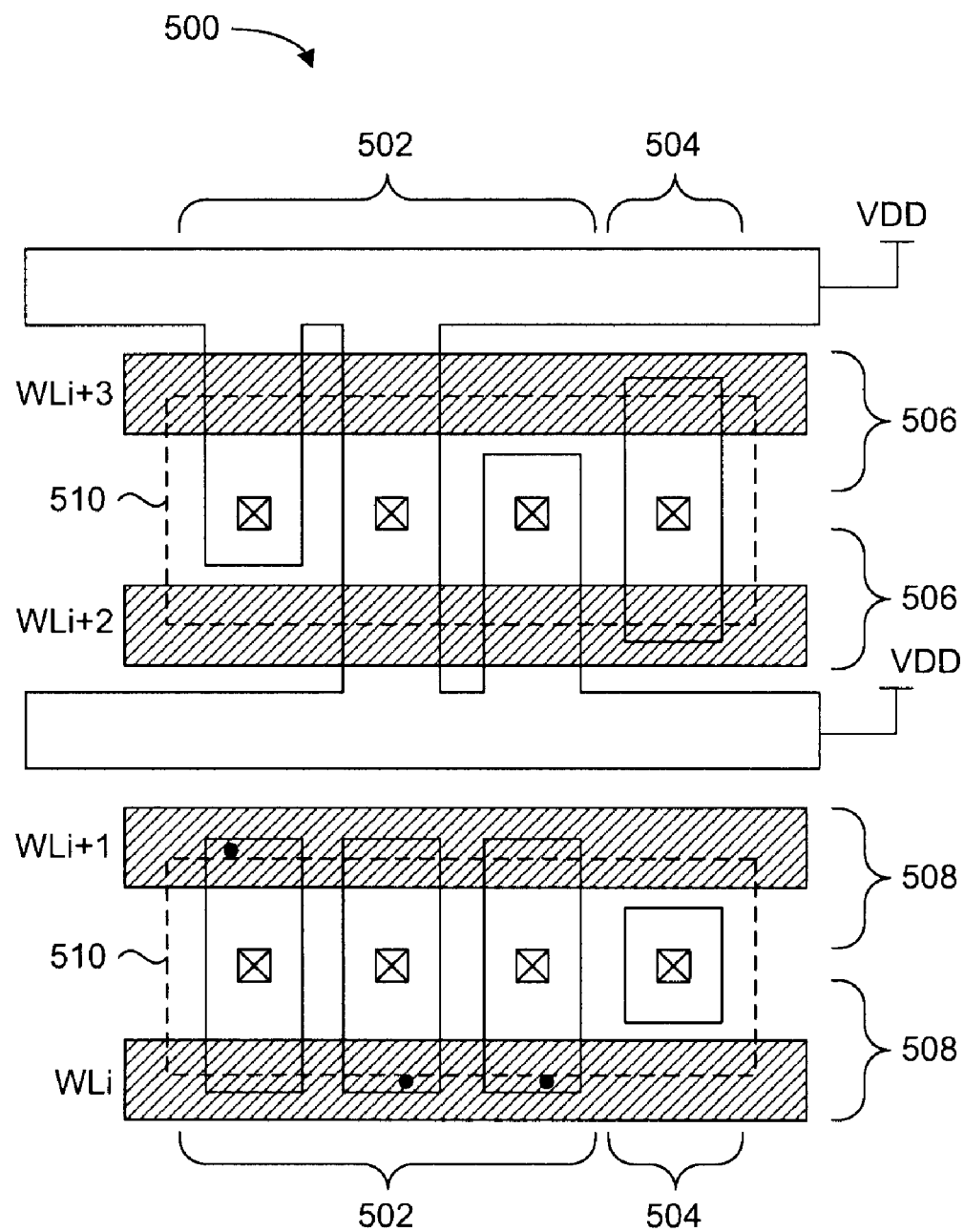
FIG. 16a is a plan view layout of a hybrid memory array with a status array column, according to an embodiment of the present invention.

FIG. 16a is a plan view layout showing a portion of memory array 202 and status array 402. Hybrid memory array 500 includes one-transistor anti-fuse memory cells coupled to wordlines WLi and WLi+1 corresponding to rows 508, and mask programmable one-transistor anti-fuse memory cells coupled to wordlines WLi+2 and WLi+3 corresponding to rows 506. The dashed outlines 510 defines the areas in which the thick gate oxide is to be formed via an OD2 mask during the fabrication process, and is analogous to dashed outline 50 shown in FIG. 4b. Hybrid memory array 500 is divided column-wise into the memory array 502 which corresponds to the memory array 202 of FIG. 15, and a status array 504 which corresponds to the status array 402 of FIG. 15. The memory array 502 is similar to the memory array shown in FIG. 9b, which includes the same mask programmable and electrically programmable one-transistor anti-fuse memory cells. Hence details of the memory array 502 is not required. The status array 504 includes a combination of both mask programmable and electrically programmable one-transistor anti-fuse memory cells, which can be the same as those used in memory array 502. More specifically, the status array 504 will include electrically programmable anti-fuse status memory cells coupled to WLi+2 and WLi+3, and a mask programmed anti-fuse status memory cell coupled to WLi and WLi+1. Therefore, the status memory cells of status array 504 associated with a row of electrically programmable memory cells are mask programmed to store a valid status bit, while by default, the status memory cells of status array 504 associated with a row of mask programmed memory cells are fabricated as electrically programmable memory cells.

In the present example, since the status memory cells coupled to WLi and WLi+1 do not have a channel region under the polysilicon wordline, they are un-programmable. However, should a programming voltage be applied to wordlines WLi+2 or WLi+3, then the corresponding electrically programmable status memory cell will be programmed to store an invalid status bit. It is assumed that the bitline connected to all the status memory cells is grounded, or set to a voltage level effective for programming the anti-fuse memory cell in the presence of a programming voltage on the wordline. Therefore, in a subsequent read operation of WLi+2 or WLi+3, the invalid status bit is read out with the mask programmed data to indicate the invalid state of the data. Because the anti-fuse memory cells of memory array 502 coupled to WLi and WLi+1 are intended to be electrically programmable, their corresponding status memory cells of status array 504 are mask programmed to always provide a valid status bit.

Accordingly, the hybrid memory array embodiment of FIG. 16a can have rows of mask programmable anti-fuse memory cells where one of the cells of the row is an electrically programmable anti-fuse memory cell, and rows of electrically programmable anti-fuse memory cells where one of the cells of the row is a mask programmed anti-fuse memory cell. In an alternate embodiment, rows of electrically programmable anti-fuse memory cells will not have a corresponding mask programmed anti-fuse status memory cell, which will have the same effect on the corresponding bitline as a mask programmed anti-fuse status memory cell having no channel region under the wordline. Full robustness is provided by combining any of the program lock circuit embodiments of FIGS. 11 and 13 with the hybrid memory array embodiment of FIG. 16a having the status array 504. In other words, if the program lock circuits are defeated through tampering and the program voltage is forced onto the wordlines of the mask programmed anti-fuse memory cells, then the programmed status bit for that row will be programmed as well. Therefore, the system will detect the invalid status of the corresponding data upon readout.

Figure 16B:
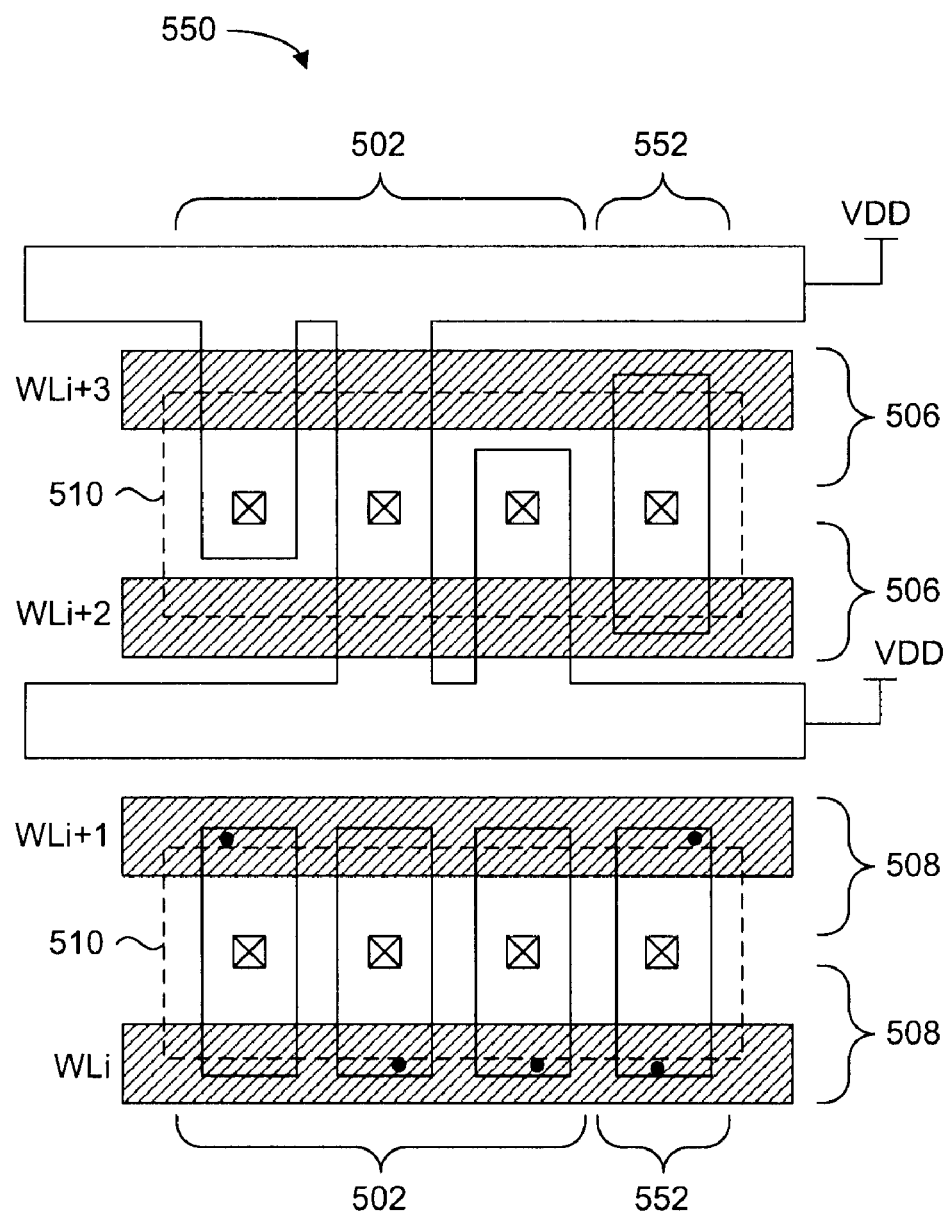
FIG. 16b is a plan view layout of a hybrid memory array with a status array column, according to an alternate embodiment of the present invention.

FIG. 16b is an alternate plan view layout of the hybrid memory array 500 shown in FIG. 16a. Hybrid memory array 550 is identical to hybrid memory array 500 except that the status array 504 is replaced with a modified status array 552. Now the status memory cells of status array 504 coupled to the electrically programmable memory cells of memory array 502 are electrically programmable memory cells. Therefore, when a row of electrically programmable memory cells is programmed, the bitline coupled to the status array 504 will be grounded to allow the status memory cell coupled to the row to be programmed at the same time. The state of the status memory cell can indicate that the corresponding row has been programmed at least once. In a read operation the validity bit will indicate that the data stored in the corresponding row is potentially invalid. For example, the data in the row is intended to be all logic zeros and hence are not supposed to be programmed at all. Alternately, the validity bit will indicate that the programming operation has been performed on the row, which was supposed to store at least one logic non-zero data, so the programmed data are potentially valid.

While the embodiments shown in FIGS. 16a and 16b uses one-transistor anti-fuse memory cells, the hybrid array can consist of any of the previously shown two-transistor anti-fuse memory cells with a status array 504 or 552 consisting of corresponding two-transistor anti-fuse memory cells. Although a single column of anti-fuse memory cells will be sufficient for tagging the status of the corresponding row of mask programmed anti-fuse memory cells, additional columns can be used to monitor other parameters such as the programmability of the electrically programmable anti-fuse memory cells.

The previously shown and described hybrid memory array embodiments combines both mask ROM programmability for storing preset data and OTP programmability for storing user data. The hybrid memory array is simple and reliable high density, anti-fuse array architecture suitable for implementation in standard CMOS technology, without any additional processing steps and with limited over-voltage exposure of switching elements.

In the preceding description, for purposes of explanation, numerous details are set forth in order to provide a thorough understanding of the embodiments of the invention. However, it will be apparent to one skilled in the art that these specific details are not required in order to practice the invention. In other instances, well-known electrical structures and circuits are shown in block diagram form in order not to obscure the invention. For example, specific details are not provided as to whether the embodiments of the invention described herein are implemented as a software routine, hardware circuit, firmware, or a combination thereof.

The above-described embodiments of the invention are intended to be examples only. Alterations, modifications and variations can be effected to the particular embodiments by those of skill in the art without departing from the scope of the invention, which is defined solely by the claims appended hereto.

What is claimed is:

1. A hybrid memory having electrically programmable and mask programmed memory cells arranged in rows and columns, comprising:

a row of electrically programmable anti-fuse memory cells, each electrically programmable anti-fuse memory cell being connected to a bitline and having a predetermined layout and a gate oxide structure;

a row of mask programmed anti-fuse memory cells, each mask programmed anti-fuse memory cell being connected to the bitline connected to one electrically programmable anti-fuse memory cell, and having substantially the predetermined layout and the gate oxide structure, each mask programmed anti-fuse memory cell representing one logic state being selectively mask programmed to have a permanent coupling to a voltage supply.

2. The hybrid memory of claim 1, wherein the row of mask programmed anti-fuse memory cells includes an electrically programmable status memory cell.

3. The hybrid memory of claim 2, wherein the electrically programmable status memory cell is identical to each of the electrically programmable anti-fuse memory cells.

4. The hybrid memory of claim 1, wherein the permanent coupling includes a contact electrically connected to the voltage supply, and coupled to the bitline when a corresponding wordline is activated.

5. The hybrid memory of claim 1, wherein the permanent coupling includes a diffusion region connected to the voltage supply, and coupled to the bitline when a corresponding wordline is activated.

6. The hybrid memory of claim 1, wherein the permanent coupling includes a diffusion region connected to a corresponding wordline, and coupled to the bitline when the corresponding wordline is driven to the voltage supply.

7. The hybrid memory of claim 1, wherein each mask programmed anti-fuse memory cell representing another logic state is selectively mask programmed to omit a channel region.

8. The hybrid memory of claim 1, wherein the row of mask programmed anti-fuse memory cells are coupled to a wordline receiving a programming voltage, the hybrid memory further including a program lock circuit coupled to the wordline for inhibiting the programming of the row of mask programmed anti-fuse memory cells.

9. The hybrid memory of claim 8, wherein the program lock circuit includes a mask programmable inhibit circuit coupled to the wordline and programmed to a lock state for changing the programming voltage to a voltage level ineffective for programming in response to the wordline at the programming voltage.

10. The hybrid memory of claim 1, wherein each of the electrically programmable anti-fuse memory cells and each of the mask programmable anti-fuse memory cells includes an access transistor having a first diffusion region coupled to the bitline, and a first polysilicon gate, and an electrically programmable anti-fuse transistor in series with the access transistor and having a second diffusion region shared with the access transistor, and a second polysilicon gate, the gate oxide structure including a thick gate oxide under the first polysilicon gate and a thin gate oxide under the second polysilicon gate.

11. The hybrid memory of claim 10, wherein the first polysilicon gate is drivable to a read voltage during a read operation.

12. The hybrid memory of claim 11, wherein the second polysilicon gate is drivable to a programming voltage during a programming operation.

13. The hybrid memory of claim 10, wherein the first polysilicon gate and the second polysilicon gate are electrically coupled to each other and to a wordline drivable to a programming voltage.

14. The hybrid memory of claim 10, wherein the permanent coupling includes a contact electrically connected to the voltage supply, and coupled to the bitline when the access transistor is activated.

15. The hybrid memory of claim 10, wherein the permanent coupling includes a third diffusion region connected to the voltage supply, and coupled to the bitline when the access transistor and the electrically programmable anti-fuse transistor are activated.

16. The hybrid memory of claim 10, wherein the permanent coupling includes a third diffusion region connected to a diffusion line, the diffusion line being coupled to the second polysilicon gate.

17. The hybrid memory of claim 10, wherein each mask programmed anti-fuse memory cell representing another logic state is selectively mask programmed to omit a channel region.

18. The hybrid memory of claim 1, wherein each of the electrically programmable anti-fuse memory cells and each of the mask programmed anti-fuse memory cells includes
an electrically programmable anti-fuse transistor having a diffusion region coupled to the bitline, and a polysilicon gate, the gate oxide structure including an oxide breakdown region fusible to form a conductive channel between the polysilicon gate and a substrate beneath the gate oxide structure.

19. The hybrid memory of claim 18, wherein the gate oxide structure includes a variable thickness gate oxide having a thin gate oxide portion corresponding to the oxide breakdown region.

20. The hybrid memory of claim 18, wherein the permanent coupling includes another diffusion region connected to the voltage supply, and coupled to the bitline when a wordline coupled to the polysilicon gate is activated.

21. The hybrid memory of claim 18, wherein the permanent coupling includes another diffusion region connected to a diffusion line, the diffusion line being coupled to the polysilicon gate.

22. The hybrid memory of claim 18, wherein each mask programmed anti-fuse memory cell representing another logic state is selectively mask programmed to omit a channel region.

23. A hybrid memory comprising:
an electrically programmable anti-fuse memory cell, the electrically programmable anti-fuse memory cell being connected to a corresponding bitline and a common wordline; and,
a mask programmed memory cell connected to another bitline and the common wordline for storing a validity bit.

24. The hybrid memory of claim 23, wherein the electrically programmable anti-fuse memory cell includes
an electrically programmable anti-fuse transistor having a diffusion region coupled to the bitline, and a polysilicon gate overlying a gate oxide structure, the gate oxide structure having an oxide breakdown region fusible to form a conductive channel between the polysilicon gate and a substrate beneath the gate oxide structure.

25. The hybrid memory of claim 24, wherein the mask programmed memory cell omits a channel region underlying the common wordline.

26. The hybrid memory of claim 24, wherein the mask programmed memory cell includes a permanent coupling to a voltage supply.

27. The hybrid memory of claim 26, wherein the permanent coupling includes another diffusion region connected to the voltage supply, and coupled to the bitline when the wordline coupled to the polysilicon gate is activated.

28. The hybrid memory of claim 24, further including
a second mask programmed memory cell connected to the corresponding bitline and a second common wordline, and
a second electrically programmable anti-fuse memory cell connected to the another bitline and the second common wordline.

29. The hybrid memory of claim 23, wherein the electrically programmable anti-fuse memory cell includes
an access transistor having a first diffusion region coupled to the bitline, and a first polysilicon gate,
an electrically programmable anti-fuse transistor in series with the access transistor and having a second diffusion region shared with the access transistor, and a second polysilicon gate, the gate oxide structure including a thick gate oxide under the first polysilicon gate and a thin gate oxide under the second polysilicon gate.

* * * * *